(12) United States Patent
Komatsu et al.

(10) Patent No.: US 9,748,924 B2
(45) Date of Patent: Aug. 29, 2017

(54) ELASTIC WAVE ELEMENT WITH INTERDIGITAL TRANSDUCER ELECTRODE

(71) Applicant: SKYWORKS FILTER SOLUTIONS JAPAN CO., LTD., Kadoma-Shi (JP)

(72) Inventors: Tomoya Komatsu, Osaka-Fu (JP); Hiroyuki Nakamura, Osaka-Fu (JP); Tetsuya Tsurunari, Osaka-Fu (JP); Joji Fujiwara, Osaka-Fu (JP); Hidekazu Nakanishi, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 136 days.

(21) Appl. No.: 14/809,994

(22) Filed: Jul. 27, 2015

(65) Prior Publication Data
US 2015/0333731 A1 Nov. 19, 2015

Related U.S. Application Data

(63) Continuation of application No. 14/004,163, filed as application No. PCT/JP2012/001489 on Mar. 5, 2012, now Pat. No. 9,136,458.

(30) Foreign Application Priority Data

Mar. 22, 2011 (JP) .................. 2011-061959

(51) Int. Cl.
*H03H 9/25* (2006.01)
*H03H 9/02* (2006.01)
*H01L 41/047* (2006.01)

(52) U.S. Cl.
CPC ............. *H03H 9/25* (2013.01); *H01L 41/047* (2013.01); *H03H 9/02818* (2013.01); *H03H 9/02992* (2013.01)

(58) Field of Classification Search
CPC .. H03H 9/25; H03H 9/02818; H03H 9/02992; H01L 41/047
(Continued)

(56) References Cited

U.S. PATENT DOCUMENTS 7,132,779 B2 11/2006 Kando
7,576,471 B1 8/2009 Solal
(Continued)

FOREIGN PATENT DOCUMENTS

EP 196242 A1 10/1986
JP S56100512 A 12/1981
(Continued)

OTHER PUBLICATIONS

International Search Report of PCT Application No. PCT/JP2012/001489 dated Mar. 5, 2012.

*Primary Examiner* — Thomas Dougherty
(74) *Attorney, Agent, or Firm* — Lando & Anastasi, LLP

(57) ABSTRACT

An elastic wave device includes an interdigital transducer (IDT) electrode in contact with a piezoelectric substrate having a bus bar electrode region including one of a first bus bar electrode and a second bus bar electrode of the IDT electrode, an alternately disposed region where first electrode fingers are alternately disposed with second electrode fingers of the IDT electrode, and an intermediate region including one of the first electrode fingers and the second electrode fingers. A dielectric film is formed in at least part of the intermediate region and in contact with an upper surface of the IDT electrode. The dielectric film includes a medium in which an acoustic velocity of a transverse wave propagating in the dielectric film is lower than an acoustic velocity of a main elastic wave of the alternately disposed region. The dielectric film is not formed in the alternately disposed region.

21 Claims, 37 Drawing Sheets

(58) Field of Classification Search
USPC .......................... 333/193–196; 310/311–371
See application file for complete search history.

(56) References Cited

U.S. PATENT DOCUMENTS

| | | | |
|---|---|---|---|
| 7,939,989 B2 | | 5/2011 | Solal et al. |
| 7,965,155 B2 * | | 6/2011 | Nakamura ......... H03H 9/02858 |
| | | | 310/313 B |
| 9,136,458 B2 * | | 9/2015 | Komatsu ............ H03H 9/02818 |
| 2002/0057036 A1 | | 5/2002 | Taniguchi et al. |
| 2004/0251990 A1 | | 12/2004 | Ueda et al. |
| 2007/0018755 A1 | | 1/2007 | Mayer et al. |
| 2009/0267707 A1 | | 10/2009 | Miura et al. |
| 2010/0219905 A1 | | 9/2010 | Nakamura et al. |
| 2012/0044027 A1 | | 2/2012 | Nakanishi et al. |
| 2012/0146457 A1 | | 6/2012 | Goto et al. |
| 2013/0051588 A1 | | 2/2013 | Ruile et al. |
| 2013/0249647 A1 | | 9/2013 | Nakanishi et al. |

FOREIGN PATENT DOCUMENTS

| | | | | |
|---|---|---|---|---|
| JP | 08-032397 A | * | 2/1996 | ............ H03H 9/145 |
| JP | H0832397 A | | 2/1996 | |
| JP | 2002100952 A | | 4/2002 | |
| JP | 2004328196 A | | 11/2004 | |
| JP | 2007-110342 | * | 10/2005 | ............ H03H 9/145 |
| JP | 2007110342 A | | 4/2007 | |
| JP | 2009232242 A | | 10/2009 | |
| JP | 2009-209472 A | * | 12/2009 | ............ H03H 9/145 |
| JP | 2009290472 A | | 12/2009 | |
| JP | 2011-19249 A | * | 1/2011 | ............ H03H 9/145 |
| WO | 2010137279 A1 | | 12/2010 | |
| WO | 2011030519 A1 | | 3/2011 | |
| WO | 2011088904 A1 | | 7/2011 | |

* cited by examiner

ELASTIC WAVE ELEMENT WITH INTERDIGITAL TRANSDUCER ELECTRODE

RELATED APPLICATIONS

This application claims priority under 35 U.S.C. §120 as a continuation of U.S. patent application Ser. No. 14/004,163, titled "ELASTIC WAVE ELEMENT," filed on Sep. 10, 2013, which is herein incorporated by reference in its entirety. U.S. patent application Ser. No. 14/004,163 is a U.S. national phase application of PCT Application PCT/JP2012/001489, titled "ELASTIC WAVE ELEMENT," filed on Mar. 5, 2012 which claims priority to Japanese Patent Application Serial No. 2011-061959, filed on Mar. 22, 2011.

TECHNICAL FIELD

The present invention relates to an elastic wave element using a piezoelectric effect.

BACKGROUND ART

FIG. 35A is a top schematic view of a conventional elastic wave element. FIG. 35B is a sectional schematic view taken on line 35B-35B (in an extending direction of electrode fingers) of FIG. 35A. FIG. 35C is a graph showing acoustic velocity of a main elastic wave in FIG. 35B.

Elastic wave element 101 includes lithium tantalate piezoelectric substrate 102, IDT (Inter Digital Transducer) electrode 103, and reflector electrodes 104. IDT electrode 103 is formed on piezoelectric substrate 102 and excites a main elastic wave having wavelength λ. Reflector electrodes 104 are formed on piezoelectric substrate 102 in such a manner that they sandwich IDT electrode 103.

IDT electrode 103 includes first bus bar electrode 121 and second bus bar electrode 221 facing first bus bar electrode 121. Furthermore, IDT electrode 103 includes first electrode fingers 123 extending from first bus bar electrode 121 to second bus bar electrode 221, and second electrode fingers 223 extending from second bus bar electrode 221 to first bus bar electrode 121. Furthermore, IDT electrode 103 includes first dummy electrodes 122 extending from first bus bar electrode 121 to second bus bar electrode 221, and second dummy electrodes 222 extending from second bus bar electrode 221 to first bus bar electrode 121.

Bus bar electrode region 106, dummy electrode region 107, intermediate region 108, and alternately disposed region 109 are formed on piezoelectric substrate 102. Bus bar electrode region 106 includes first bus bar electrode 121 or second bus bar electrode 221. Dummy electrode region 107 includes first dummy electrodes 122 and first electrode fingers 123 or second dummy electrodes 222 and second electrode fingers 223. Alternately disposed region 109 includes first electrode fingers 123 and second electrode fingers 223 which are alternately disposed. Intermediate region 108 includes any one of first electrode fingers 123 and second electrode fingers 223.

Furthermore, by forming, for example, heavy metal layer 110 on a part of bus bar electrode region 106 so as to increase the thickness, a main elastic wave in alternately disposed region 109 can be trapped in elastic wave element 101.

However, in elastic wave element 101, heavy metal layer 110 can be formed only in bus bar electrode region 106 of IDT electrode 103. Therefore, an effect of trapping the main elastic wave in alternately disposed region 109 is not sufficient.

In a resonator formed of lithium tantalate piezoelectric substrate 102, energy of the main elastic wave excited by IDT electrode 103 tends to be shifted to a region in which acoustic velocity is high. This is because the lithium tantalate piezoelectric substrate has an anisotropy index of $\gamma<0$ in the propagation direction.

As shown in FIG. 35C, the acoustic velocity of the main elastic wave in intermediate region 108 is higher than the acoustic velocity of the main elastic wave in alternately disposed region 109. Therefore, the main elastic wave of alternately disposed region 109 leaks into intermediate region 108, so that characteristic loss of elastic wave element 101 may occur.

Note here that prior art literatures related to the present invention include Patent Literatures 1 and 2.

CITATION LIST

Patent Literature

Patent Literature 1: Japanese Patent No. 341261
Patent Literature 1: Japanese Patent No. 3929415

SUMMARY OF THE INVENTION

An elastic wave element of the present invention includes a piezoelectric substrate, an IDT electrode that is provided in contact with the piezoelectric substrate, and a first dielectric film. The IDT electrode includes a first bus bar electrode, a second bus bar electrode facing the first bus bar electrode, first electrode fingers extending from the first bus bar electrode toward the second bus bar electrode, and second electrode fingers extending from the second bus bar electrode toward the first bus bar electrode. The piezoelectric substrate includes a bus bar electrode region including any one of the first bus bar electrode and the second bus bar electrode, an alternately disposed region including first electrode fingers and second electrode fingers which are alternately disposed, and an intermediate region including any one of the first electrode fingers and the second electrode fingers.

A first dielectric film is formed on an uppermost surface of a laminated body composed of a piezoelectric substrate and an IDT electrode, and in at least a part in the extending direction of the first and second electrode fingers in the intermediate region. The first dielectric film is formed of a medium in which acoustic velocity of a transverse wave propagating in the first dielectric film is lower than acoustic velocity of the main elastic wave in the alternately disposed region.

DETAIL DESCRIPTION OF PREFERRED EMBODIMENTS

Figure 1A:
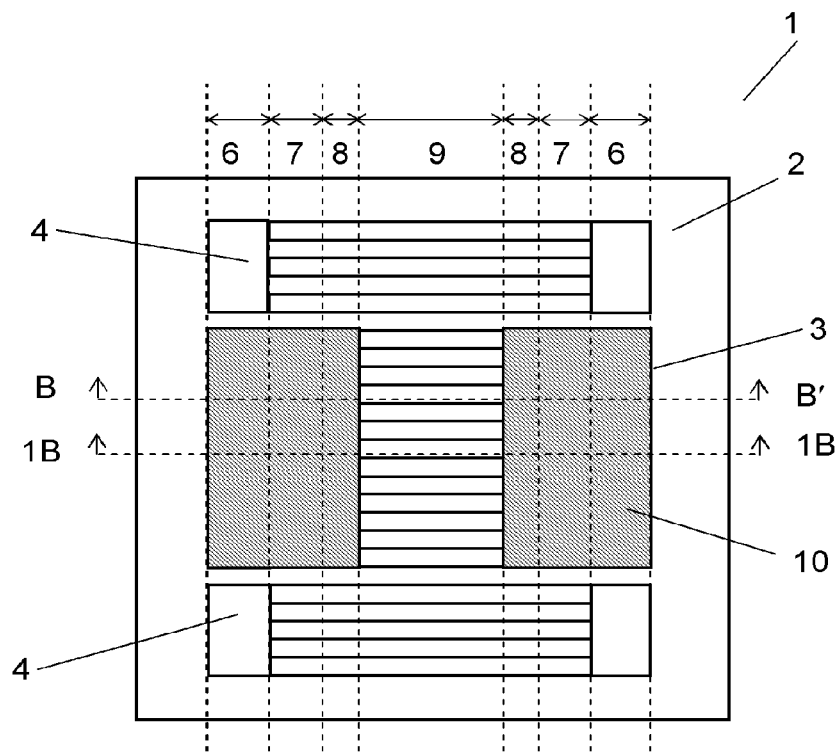
FIG. 1A is a top schematic view of an elastic wave element in accordance with a first exemplary embodiment of the present invention.

Hereinafter, embodiments for carrying out the invention are described with reference to drawings. In each exemplary embodiment, the same reference numerals are given to the same component and the description thereof is omitted.

First Exemplary Embodiment

Figure 1B:
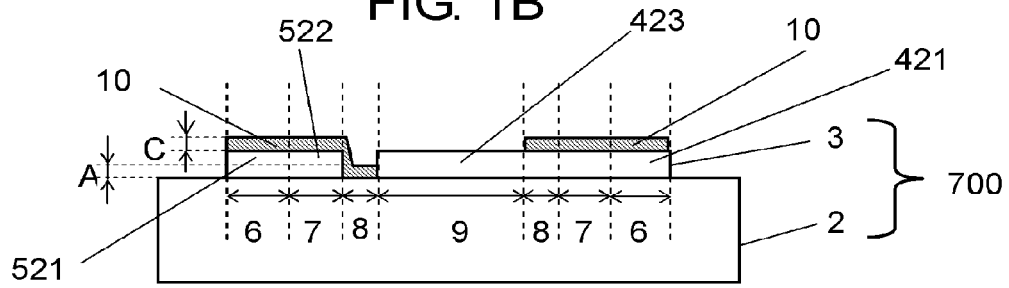
FIG. 1B is a sectional schematic view taken on line 1B-1B of FIG. 1A.
Figure 1C:
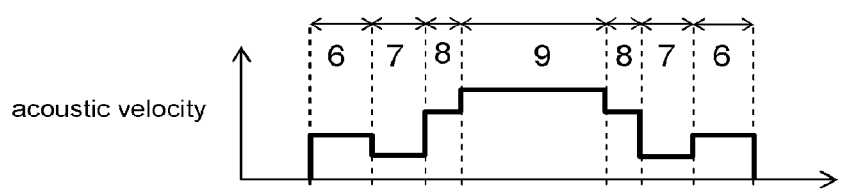
FIG. 1C is a graph showing acoustic velocity of a main elastic wave of FIG. 1B.
Figure 1D:
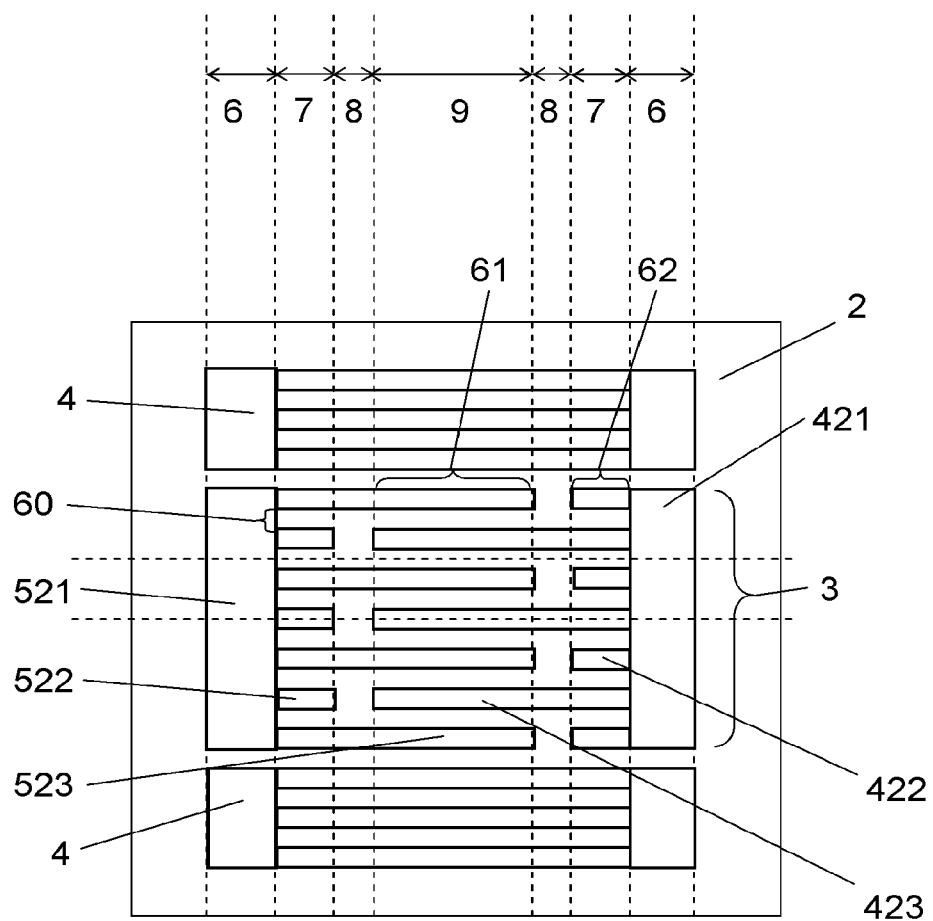
FIG. 1D is a top schematic view showing configurations of a piezoelectric substrate, an IDT electrode, and a reflector electrode in accordance with the first exemplary embodiment of the present invention.

FIG. 1A is a top schematic view of an elastic wave element in accordance with a first exemplary embodiment of the present invention. FIG. 1B is a sectional schematic view taken on line 1B-1B (in an extending direction of electrode fingers) of FIG. 1A. FIG. 1C is a graph showing acoustic velocity of a main elastic wave of FIG. 1B. FIG. 1D is a top schematic view showing configurations of a piezoelectric substrate, an IDT electrode and a reflector electrode in accordance with the first exemplary embodiment of the present invention.

Elastic wave element 1 includes piezoelectric substrate 2, IDT (Inter Digital Transducer) electrode 3, first dielectric film 10, and reflector electrode 4.

IDT electrode 3 includes first bus bar electrode 421 and second bus bar electrode 521 facing first bus bar electrode 421. Furthermore, IDT electrode 3 includes first electrode fingers 423 extending from first bus bar electrode 421 toward second bus bar electrode 521, and second electrode fingers 523 extending from second bus bar electrode 521 toward first bus bar electrode 421. Furthermore, IDT electrode 3 includes first dummy electrodes 422 extending from first bus bar electrode 421 toward second bus bar electrode 521, and second dummy electrodes 522 extending from second bus bar electrode 521 toward first bus bar electrode 421.

On piezoelectric substrate 2, bus bar electrode region 6, dummy electrode region 7, intermediate region 8, and alternately disposed region 9 are formed in this order from an outer side of IDT electrode 3 in the extending direction of electrode fingers.

Bus bar electrode region 6 includes first bus bar electrode 421 or second bus bar electrode 521. Dummy electrode region 7 includes any one of first dummy electrodes 422 and first electrode fingers 423 and second dummy electrodes 522 and second electrode fingers 523.

Alternately disposed region 9 includes first electrode fingers 423 and second electrode fingers 523 which are alternately disposed. Intermediate region 8 includes any one of first electrode fingers 423 and second electrode fingers 523. IDT electrode 3 excites the main elastic wave.

First dielectric film 10 is formed in intermediate region 8, dummy electrode region 7, and bus bar electrode region 6, and is not formed on alternately disposed region 9. IDT electrode 3 in alternately disposed region 9 is exposed. That is to say, first dielectric film 10 is formed along the extending direction of the first and second electrode fingers in intermediate region 8, dummy electrode region 7, and bus bar electrode region 6 and on the uppermost surface of laminated body 700 composed of piezoelectric substrate 2 and IDT electrode 3.

First dielectric film 10 is formed of a medium in which acoustic velocity of a transverse wave propagating in first dielectric film 10 is lower than acoustic velocity of the main elastic wave in alternately disposed region 9.

In this exemplary embodiment, bus bar electrode region 6 side is referred to as an "outer side" and alternately disposed region 9 side is referred to as an "inner side" in the extending direction of the electrode fingers.

IDT electrode 3 is formed on piezoelectric substrate 2, and excites a main elastic wave having wavelength λ (a surface elastic wave such as a Shear Horizontal wave). Reflector electrodes 4 are formed on piezoelectric substrate 2 in such a manner that they sandwich IDT electrode 3. At this time, wavelength λ, is two times as large as electrode pitch 60 of FIG. 1D.

With the above-mentioned configuration, as shown in FIG. 1C, a difference between the acoustic velocity of the main elastic wave in intermediate region 8 and the acoustic velocity of the main elastic wave in alternately disposed region 9 can be reduced. That is to say, since the acoustic velocity of the main elastic wave in intermediate region 8 can made to be lower than the acoustic velocity of the main elastic wave in alternately disposed region 9, it is possible to suppress leakage of the main elastic wave of alternately disposed region 9 into intermediate region 8. As a result, characteristic loss of elastic wave element 1 can be reduced.

Each configuration of elastic wave element 1 in this exemplary embodiment is described in detail. Piezoelectric substrate 2 is, for example, a lithium tantalate substrate having anisotropy index γ in the propagation direction of negative (hereinafter, referred to as "γ<0"). In this exemplary embodiment, a lithium tantalate (LiTaO$_3$) substrate is used. Herein, the piezoelectric substrate having the anisotropy index of γ<0 is a piezoelectric substrate in which an inverse speed surface with respect to the propagation direction of the main elastic wave is a concave surface. More specifically, it is, for example, 36° to 50° Y-cut X propagation lithium tantalate (LiTaO$_3$) substrate.

IDT electrode 3 has a configuration of, for example, elemental substance metal of aluminum, copper, silver, gold, titanium, tungsten, platinum, chromium, or molybdenum, or alloy mainly including the metals or laminate of these metals. A thickness of IDT electrode 3 is about 0.01λ to 0.22λ where λ indicates a wavelength of the main elastic wave.

In FIG. 1A, IDT electrode 3 has a normal type configuration in which an intersection width of the electrode fingers of IDT electrode 3 is substantially constant. However, for spurious suppression of the transverse mode, apodization weighting may be given such that the intersection width is reduced nearer to reflector electrode 4 from the center of IDT electrode 3. At this time, a top view shows that alternately disposed region 9 is rhombus.

First dielectric film 10 is made of, for example, tantalum oxide (Ta$_2$O$_5$), tellurium oxide (TeO$_2$), silicon oxide (SiO$_2$), or the like. However, material is not necessarily limited thereto, any material may be employed as long as it is insulating media in which the acoustic velocity of the transverse wave propagating in first dielectric film 10 is lower than the acoustic velocity of the main elastic wave in the alternately disposed region. In particular, tantalum oxide and tellurium oxide are preferable as first dielectric film 10 because they are media in which the acoustic velocity of the transverse wave is sufficiently lower than the acoustic velocity of the main elastic wave in the alternately disposed region.

When first dielectric film 10 is made of tantalum oxide, even when the thickness of first dielectric film 10 is smaller than that of IDT electrode 3, an effect of trapping the main elastic wave in alternately disposed region 9 can be obtained. Specifically, it is desirable that film thickness A of first dielectric film 10 in the upper side of intermediate region 8 is 0.001λ or more and 0.1λ or less. When film thickness A of first dielectric film 10 is less than 0.001λ, the acoustic velocity of the main elastic wave of intermediate region 8 cannot be sufficiently reduced. When film thickness A of first dielectric film 10 is more than 0.12λ, characteristics of the elastic wave element may be deteriorated.

Note here that the "film thickness of the dielectric film" in this exemplary embodiment is referred to as "distance C from the upper surface of IDT electrode 3 to the upper surface of first dielectric film 10" as shown in FIG. 1B in a portion of IDT electrode 3 in which electrode fingers are formed (for example, dummy electrode region 7 on 1B-1B section in FIG. 1A). Alternatively, it is referred to as "distance A from the upper surface of piezoelectric substrate 2 to the upper surface of first dielectric film 10" as shown in FIG. 1B in a portion of IDT electrode 3 in which electrode fingers are not formed (for example, intermediate region 8 on 1B-1B section in FIG. 1A, or dummy electrode region 7, intermediate region 8, and alternately disposed region 9 of B-B' section in FIG. 1A).

Figure 2A:
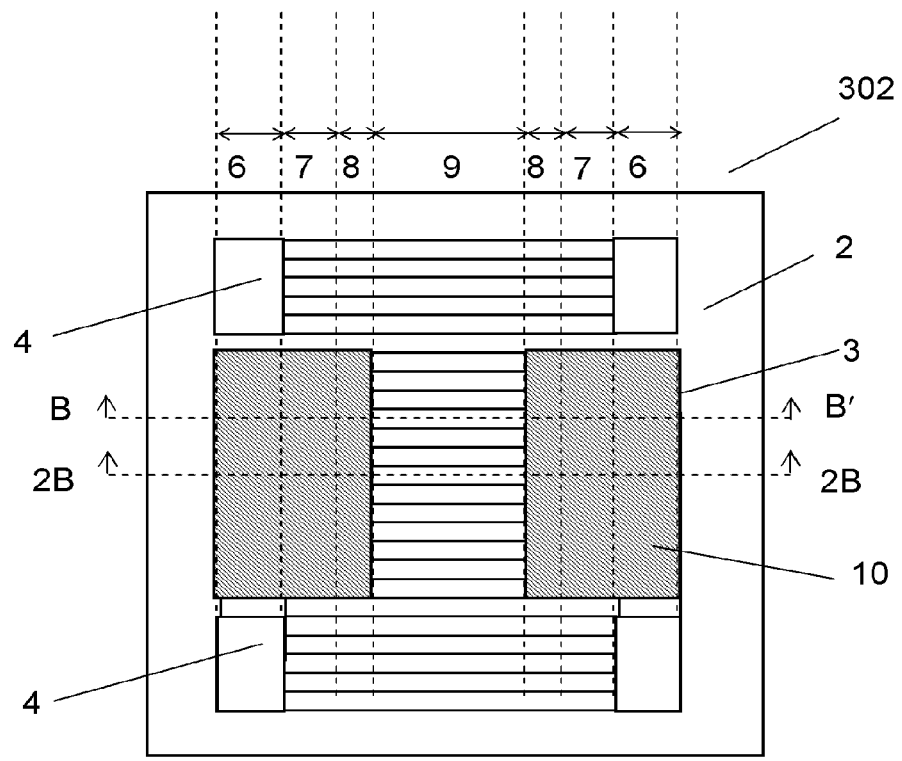
FIG. 2A is a top schematic view of another elastic wave element in accordance with the first exemplary embodiment of the present invention.
Figure 2B:
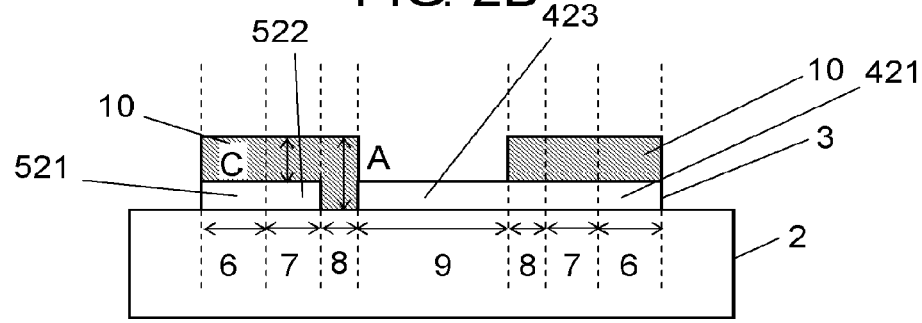
FIG. 2B is a sectional schematic view taken on line 2B-2B of FIG. 2A.
Figure 2C:
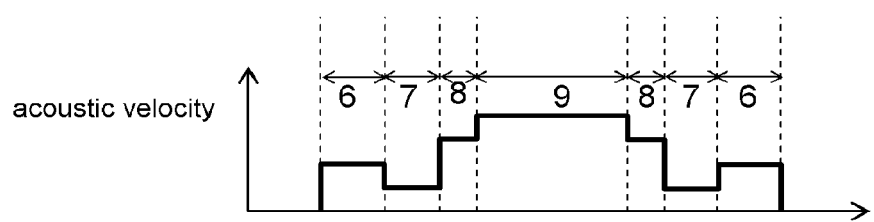
FIG. 2C is a graph showing acoustic velocity of a main elastic wave of FIG. 2B.

FIG. 2A is a top schematic view of elastic wave element 302 in accordance with the first exemplary embodiment of the present invention. FIG. 2B is a sectional schematic view taken on line 2B-2B (in an extending direction of electrode fingers) of FIG. 2A. FIG. 2C is a graph showing acoustic velocity of the main elastic wave in FIG. 2B.

When first dielectric film 10 is made of silicon oxide, the above-mentioned effect of trapping of the main elastic wave in alternately disposed region 9 can be sufficiently obtained particularly when the thickness of first dielectric film 10 is larger than that of IDT electrode 3 as shown in FIG. 2B. Specifically, it is desirable that film thickness A of first dielectric film 10 above intermediate region 8 is 0.05λ or more and 1λ or less. When film thickness A of first dielectric film 10 is less than 0.05λ, the acoustic velocity of the main elastic wave of intermediate region 8 cannot be sufficiently reduced. When film thickness A of first dielectric film 10 is more than 1λ, the characteristics of elastic wave element 302 may be deteriorated.

Figure 3:
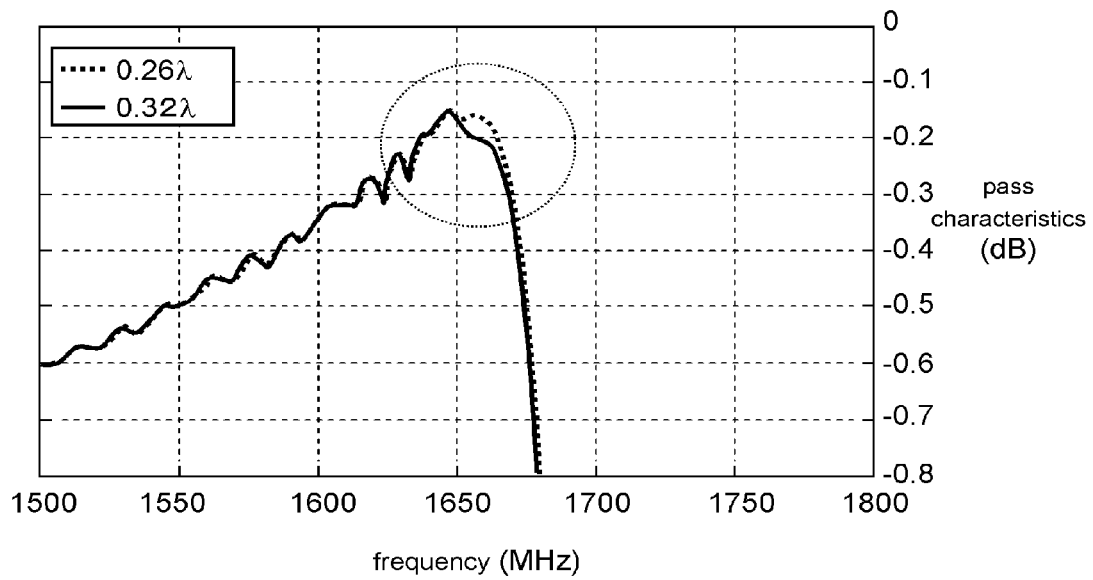
FIG. 3 is a graph showing characteristics of a conventional elastic wave element.

FIG. 3 is a graph showing pass characteristics of the elastic wave element when first dielectric film 10 is not formed in FIGS. 1A and 1B. The ordinate shows pass characteristics (dB), and the abscissa shows frequency (MHz). Piezoelectric substrate 2 is a 43° Y-cut X propagation lithium tantalate substrate. In FIG. 1D, width 61 (intersection width 61 of the electrode fingers) of alternately disposed region 9 in IDT electrode 3 is 25λ, and width 62 (dummy electrodes length 62) of dummy electrode region 7 in IDT electrode 3 is 1λ. The pitch of the IDT electrode is 1.2 μm, the number of the electrode fingers of reflector electrode 4 is 30, the number of pairs of the electrode fingers of IDT electrode 3 is 100 pairs, and a duty ratio of IDT electrode 3 (electrode finger width/pitch) is 0.5. An elastic wave element is configured as a one-port resonator, and frequency pass characteristics of the elastic element when the width of intermediate region 8 of IDT electrode 3 is 0.26λ (broken line) and 0.32λ (solid line) are measured.

As shown in FIG. 3, in the elastic wave element in which first dielectric film 10 is not formed, when the width of intermediate region 8 of IDT electrode 3 is 0.26λ and 0.32λ, loss of pass characteristics occurs around the resonance frequency (in a portion surrounded by the broken line).

Figure 4:
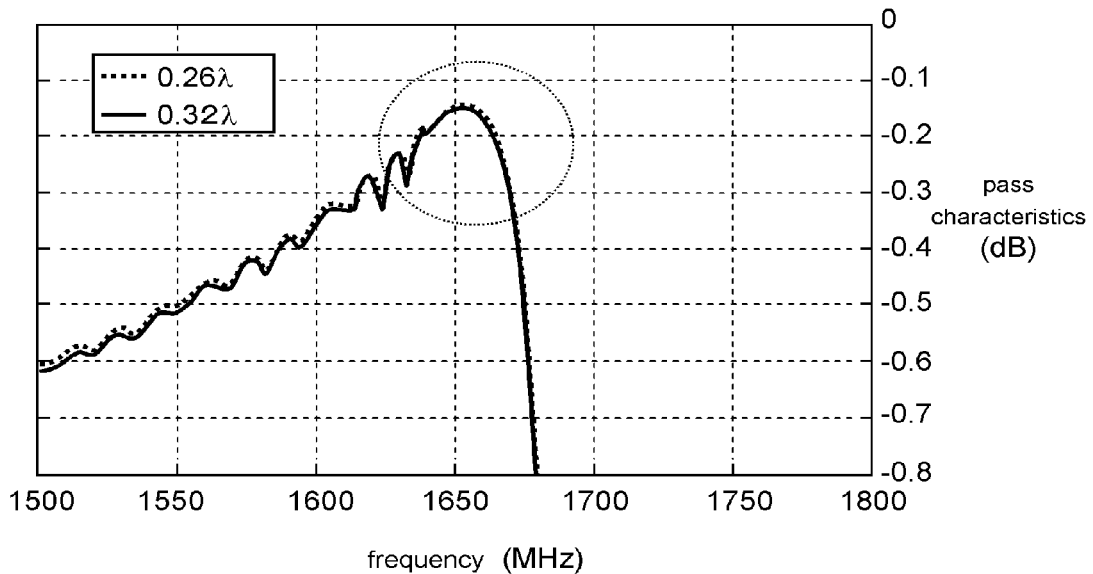
FIG. 4 is a graph showing characteristics of the elastic wave element in accordance with the first exemplary embodiment of the present invention.

FIG. 4 is a graph showing characteristics of elastic wave element 1 shown in FIGS. 1A and 1B. That it so say, FIG. 4 shows the pass characteristics of elastic wave element 1 when first dielectric film 10 is formed on intermediate region 8, dummy electrode region 7, and bus bar electrode region 6. The ordinate shows the pass characteristics, and the abscissa shows frequency. The elastic element is the same as that in FIG. 3 except that tantalum oxide having a thickness (height A from the upper surface of piezoelectric substrate 2 to the upper surface of first dielectric film 10 in intermediate region 8 in FIG. 1) of 0.018λ is formed as first dielectric film

10. The frequency pass characteristics of elastic element 1 in which the width of intermediate region 8 of IDT electrode 3 is 0.26λ (broken line) and 0.32λ (solid line) are measured, respectively.

As shown in FIG. 4, by forming first dielectric film 10, both when the width of intermediate region 8 of IDT electrode 3 is 0.26λ and when it is 0.32λ, loss of the pass characteristics around the resonance frequency (a portion surrounded by a broken line) is improved. As compared with FIG. 3, in FIG. 4, the loss of the pass characteristics is reduced by about 0.015 dB in 1650 Hz to 1670 Hz.

Note here that as a method for forming first dielectric film 10 in intermediate region 8, dummy electrode region 7 and bus bar electrode region 6 excluding alternately disposed region 9, after first dielectric film 10 is formed on IDT electrode 3, first dielectric film 10 of alternately disposed region 9 may be removed by etching. Alternatively, first dielectric film 10 may be formed on IDT electrode 3 by masking alternately disposed region 9 of IDT electrode 3.

Note here that FIG. 2B shows elastic wave element 302 having a constant height from the upper surface of piezoelectric substrate 2 to the upper surface of first dielectric film 10 in the upper side of intermediate region 8, dummy electrode region 7 and bus bar electrode region 6. Such a configuration is obtained by, for example, grinding first dielectric film 10 such that the upper surface of first dielectric film 10 is made to be flat before or after the first dielectric film 10 in the upper side of alternately disposed region 9 of IDT electrode 3 is removed by etching. However, the upper surface of first dielectric film 10 may be flat or may not be flat.

Figure 5A:
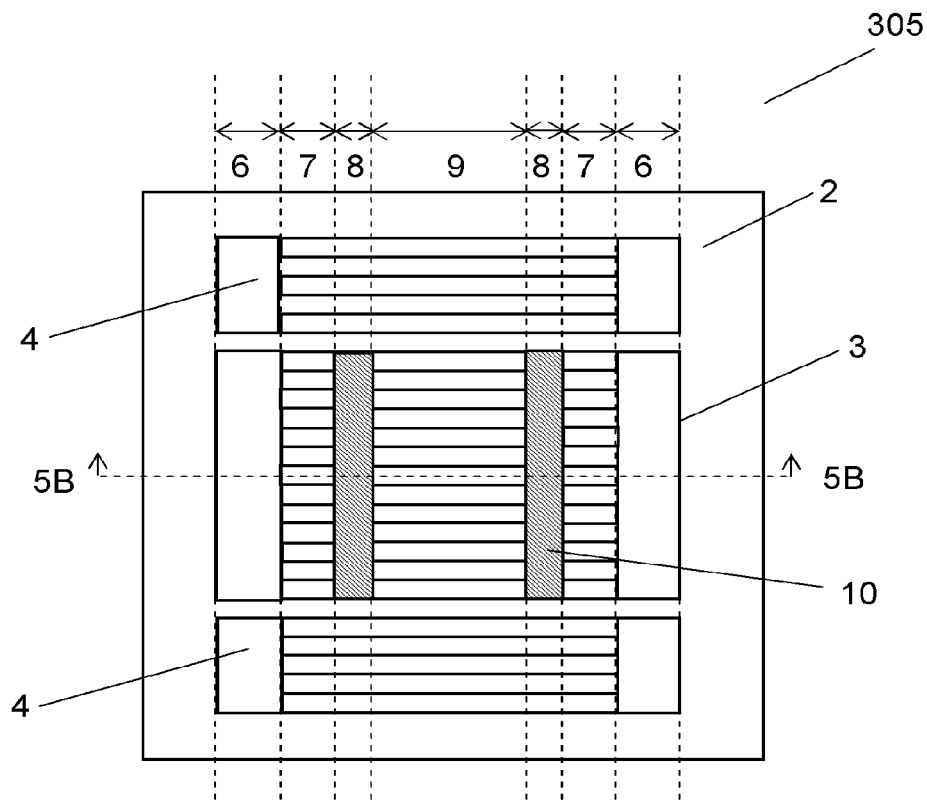
FIG. 5A is a top schematic view of still another elastic wave element in accordance with the first exemplary embodiment of the present invention.
Figure 5B:
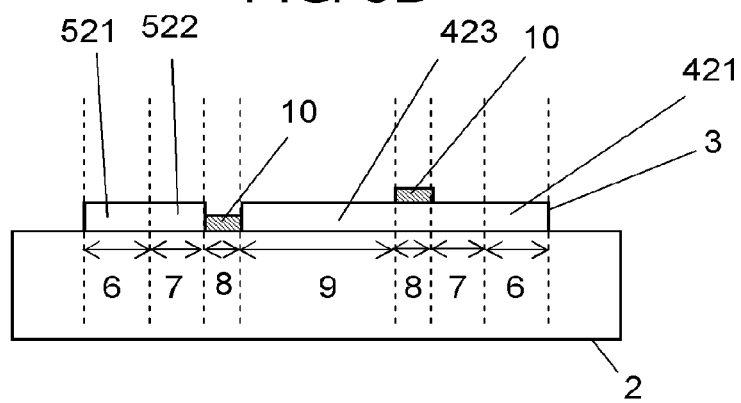
FIG. 5B is a sectional schematic view taken on line 5B-5B of FIG. 5A.

FIG. 5A is a top schematic view of elastic wave element 305 in accordance with the first exemplary embodiment of the present invention. FIG. 5B is a sectional schematic view taken on line 5B-5B (in an extending direction of electrode fingers) of FIG. 5A.

Figure 6A:
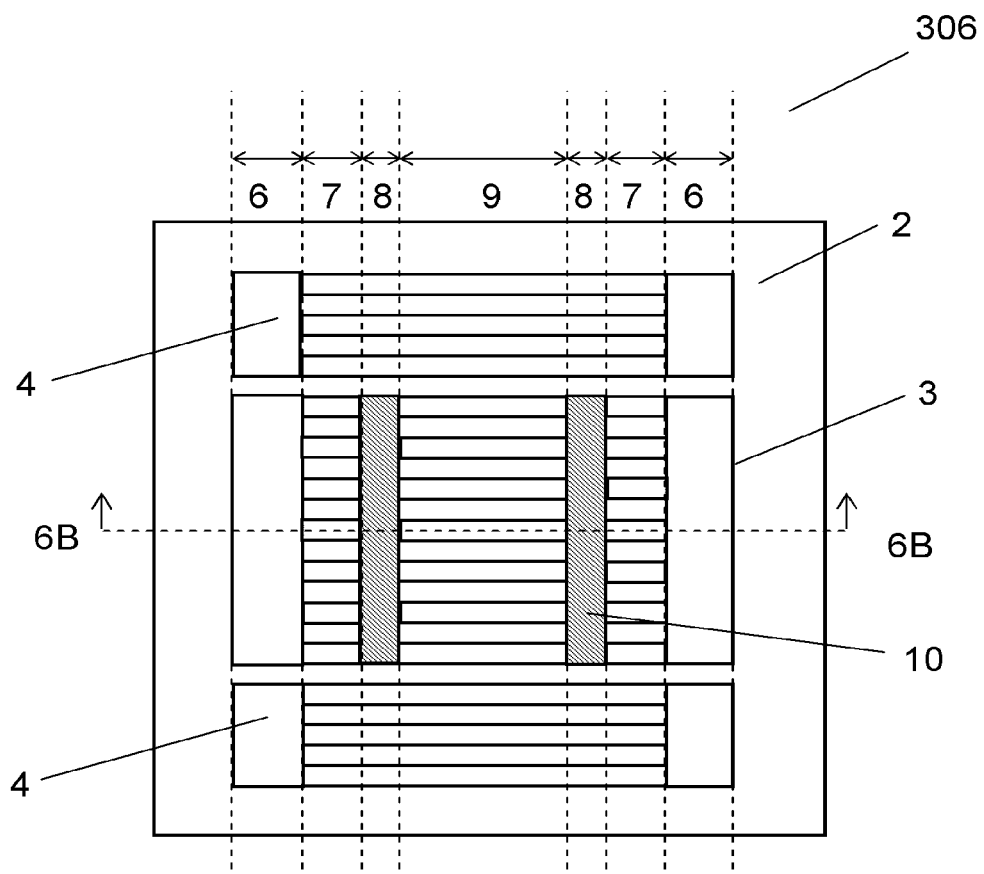
FIG. 6A is a top schematic view of yet another elastic wave element in accordance with the first exemplary embodiment of the present invention.
Figure 6B:
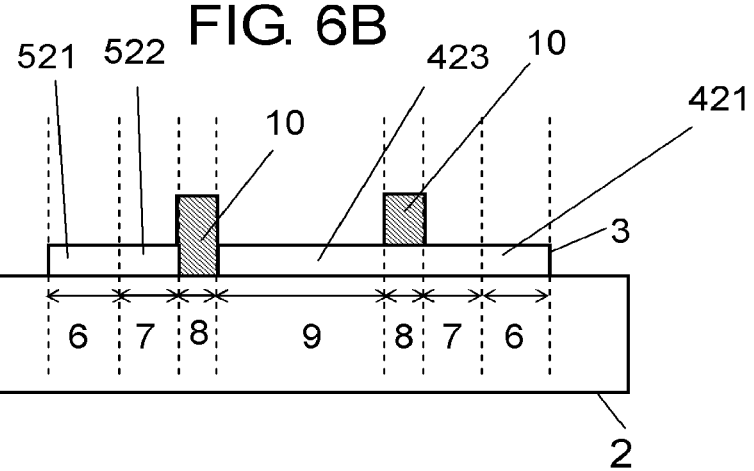
FIG. 6B is a sectional schematic view taken on line 6B-6B of FIG. 6A.

As shown in FIGS. 5A and 5B, first dielectric film 10 may be formed in at least in intermediate region 8. First dielectric film 10 may not be formed in dummy electrode region 7 or bus bar electrode region 6. Also in this case, in elastic wave element 305, a difference between acoustic velocity of a main elastic wave in intermediate region 8 and acoustic velocity of a main elastic wave in alternately disposed region 9 can be reduced. That is to say, since the acoustic velocity of the main elastic wave in intermediate region 8 can be made to be lower than the acoustic velocity of the main elastic wave in alternately disposed region 9, leakage of the main elastic wave in alternately disposed region 9 into intermediate region 8 can be suppressed. As a result, the characteristic loss of wave element 305 can be reduced. FIGS. 5A and 5B show a cross section of elastic wave element 305 when the thickness of first dielectric film 10 is smaller than that of IDT electrode 3. FIGS. 6A and 6B show elastic wave element 306 when first dielectric film 10 is larger than IDT electrode 3. Also in this case, leakage of the main elastic wave of alternately disposed region 9 into intermediate region 8 can be suppressed.

Figure 7A:
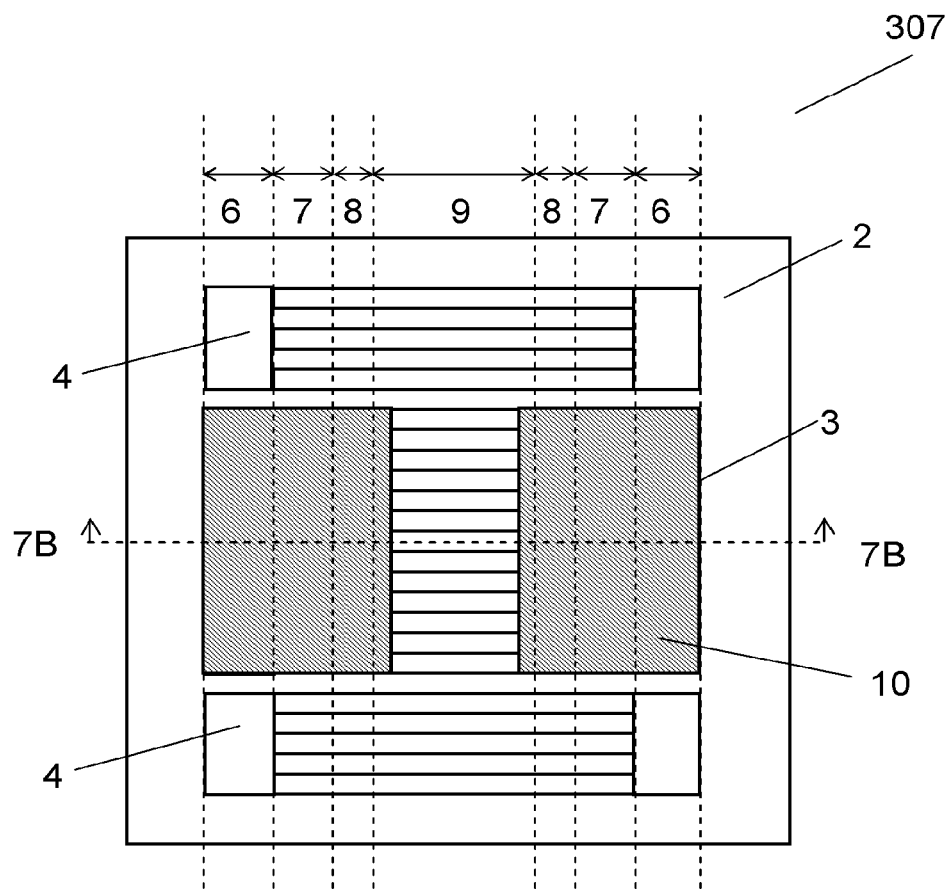
FIG. 7A is a top schematic view of a further elastic wave element in accordance with the first exemplary embodiment of the present invention.
Figure 7B:
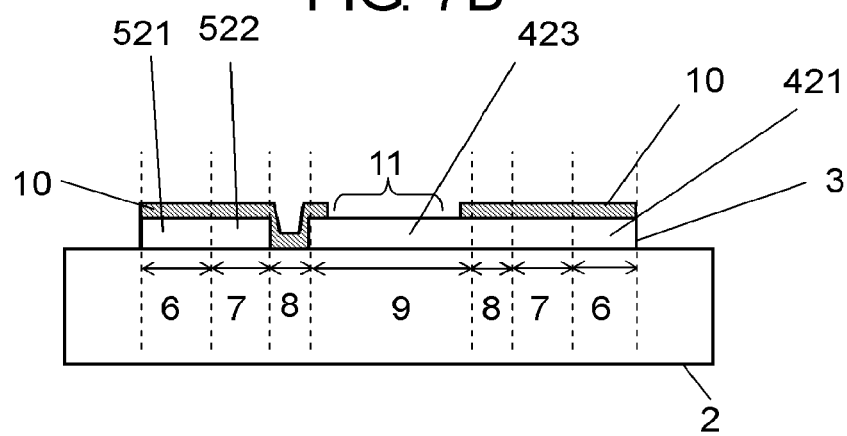
FIG. 7B is a sectional schematic view taken on line 7B-7B of FIG. 7A.
Figure 8A:
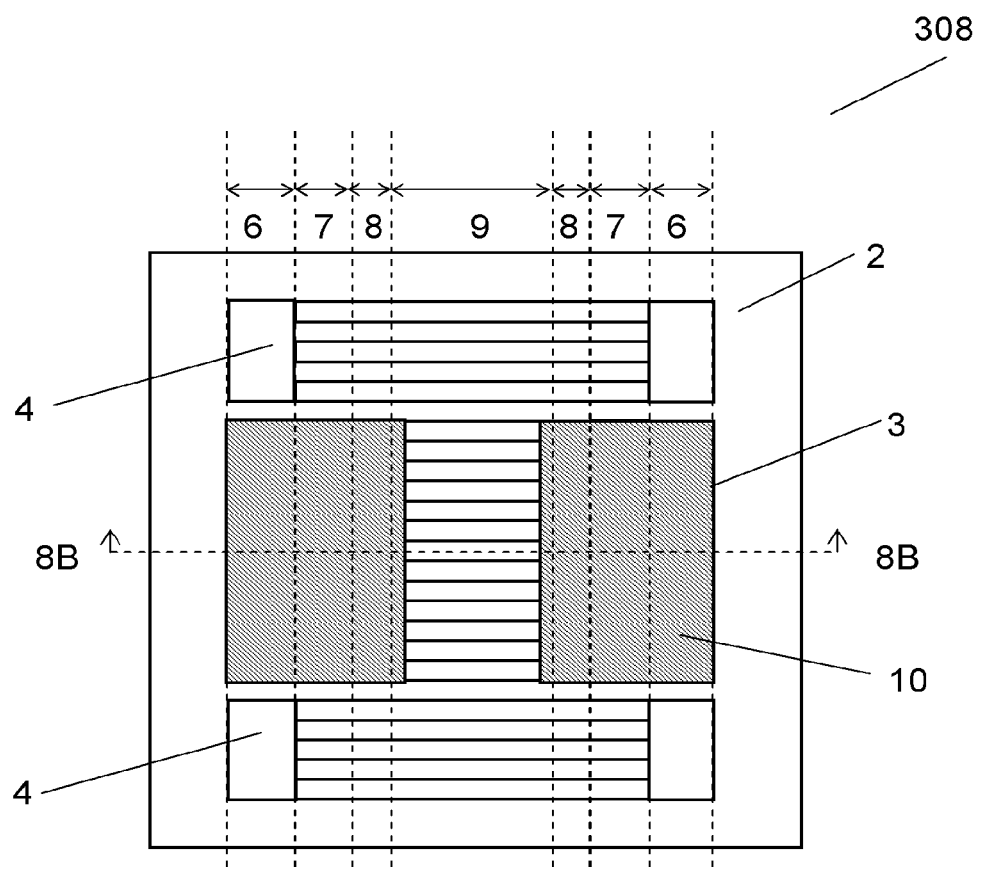
FIG. 8A is a top schematic view of a further elastic wave element in accordance with the first exemplary embodiment of the present invention.
Figure 8B:
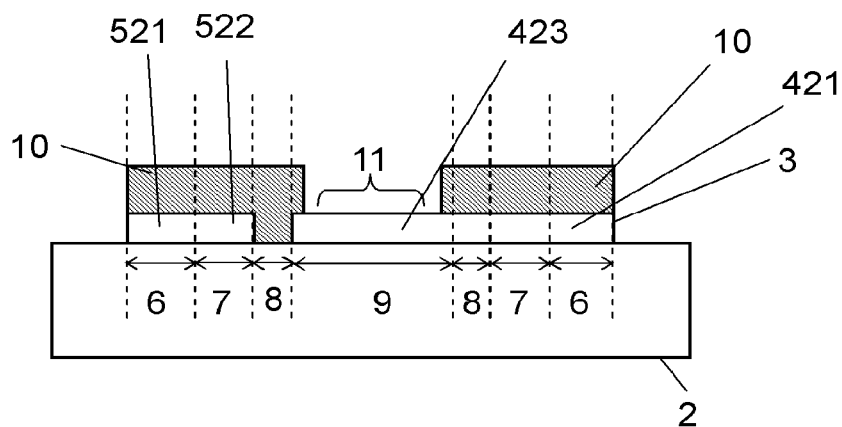
FIG. 8B is a sectional schematic view taken on line 8B-8B of FIG. 8A.

As shown in elastic wave element 307 shown in FIGS. 7A and 7B, first dielectric film 10 may be formed in a predetermined region at the inner side of alternately disposed region 9 from the end portion at intermediate region 8 side in alternately disposed region 9 of IDT electrode 3. That is to say, first dielectric film 10 may be formed in a part of alternately disposed region 9. First dielectric film 10 is not formed in center portion 11 of alternately disposed region 9 in the extending direction of the electrode fingers. With such a configuration, the end portion of first dielectric film 10 may not be positioned at tip ends of first dummy electrodes 422 and second dummy electrodes 522. Consequently, characteristics variation due to manufacturing variation of elastic wave element 307 can be suppressed. Furthermore, in elastic wave element 307, a difference between the acoustic velocity of the main elastic wave in intermediate region 8 and the acoustic velocity of the main elastic wave in alternately disposed region 9 can be reduced. That is to say, the acoustic velocity of the main elastic wave in intermediate region 8 can be lower than acoustic velocity of main elastic wave in center portion 11 of in alternately disposed region 9. Therefore, the main elastic wave of alternately disposed region 9 is concentrated in center portion 11, so that it is possible to suppress leakage of the main elastic wave into intermediate region 8. As a result, characteristic loss of elastic wave element 307 can be reduced. Note here that FIG. 7B shows a cross section of elastic wave element 307 when the thickness of first dielectric film 10 is smaller than that of IDT electrode 3. On the other hand, FIGS. 8A and 8B show elastic wave element 308 when the thickness of first dielectric film 10 is larger than that of IDT electrode 3. Also in this case, leakage of the main elastic wave of alternately disposed region 9 into intermediate region 8 can be suppressed.

Figure 9A:
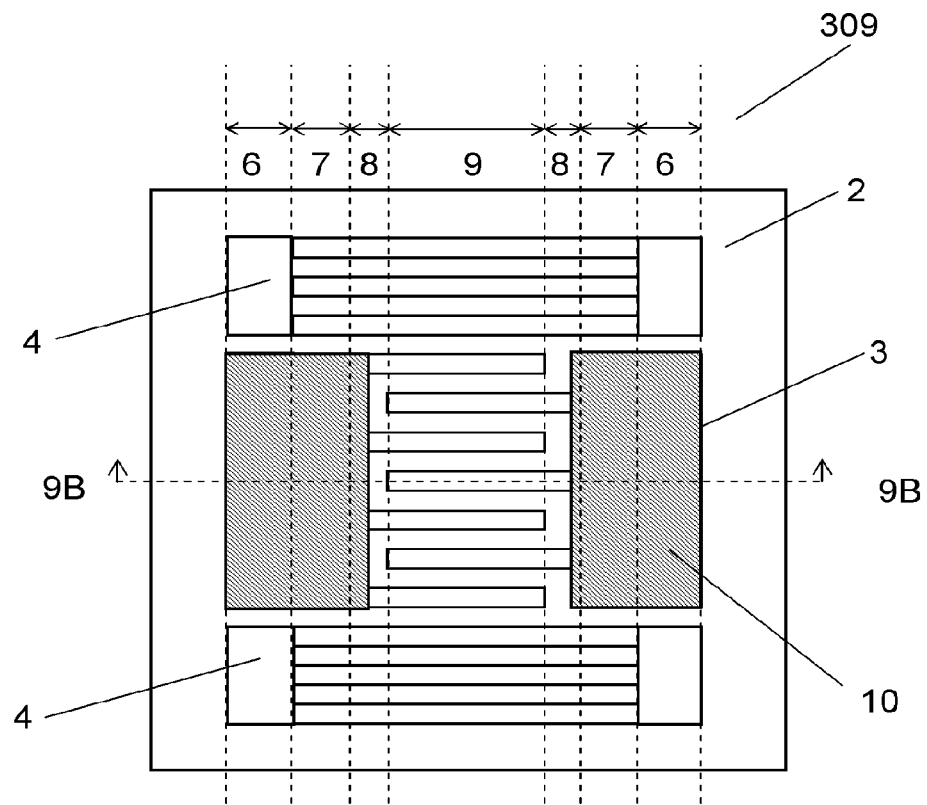
FIG. 9A is a top schematic view of a further elastic wave element in accordance with the first exemplary embodiment of the present invention.
Figure 9B:
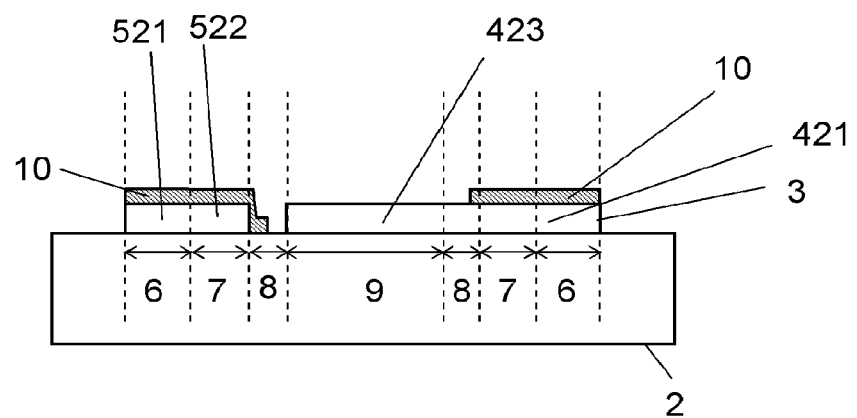
FIG. 9B is a sectional schematic view taken on line 9B-9B of FIG. 9A.
Figure 10A:
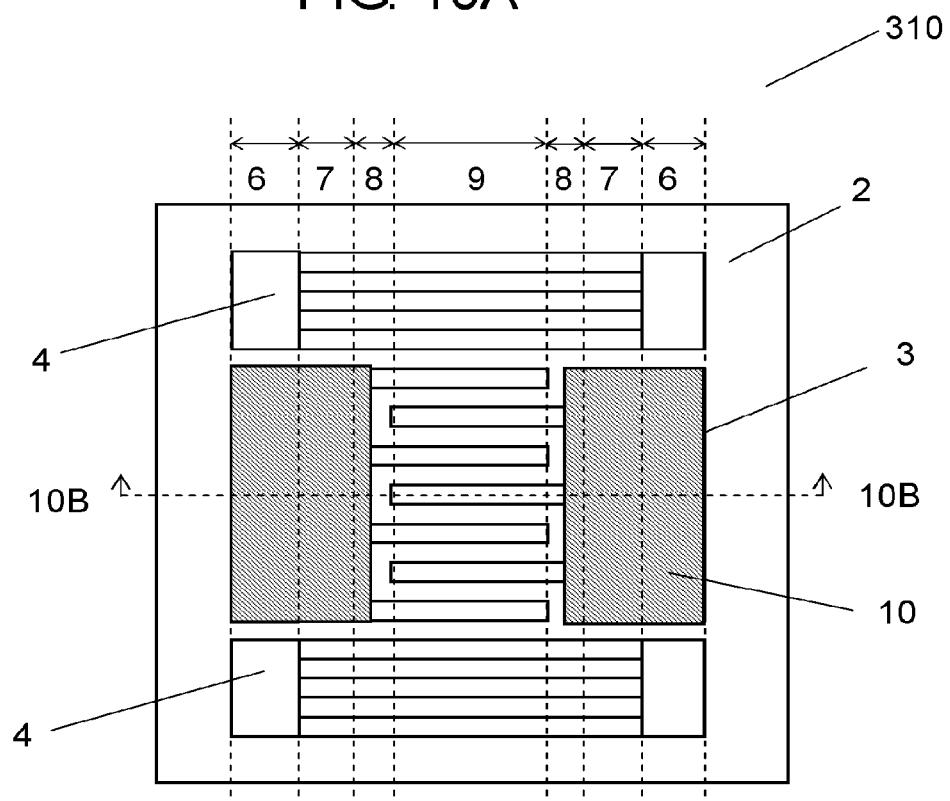
FIG. 10A is a top schematic view of a further elastic wave element in accordance with the first exemplary embodiment of the present invention.
Figure 10B:
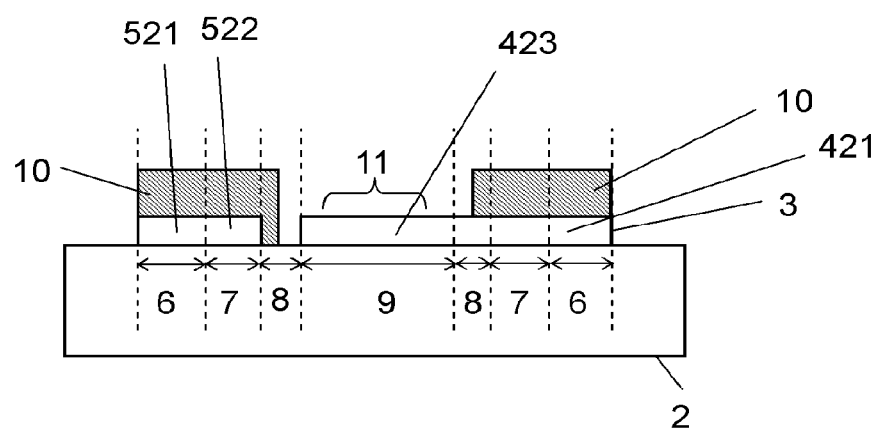
FIG. 10B is a sectional schematic view taken on line 10B-10B of FIG. 10A.

Furthermore, as shown in elastic wave element 309 shown in FIGS. 9A and 9B, in intermediate region 8 of IDT electrode 3, first dielectric film 10 may not be formed in a predetermined region from the end portion of alternately disposed region 9 to intermediate region 8. That is to say, first dielectric film 10 may not be formed in a part of intermediate region 8. With such a configuration, the end portion of first dielectric film 10 may not be positioned at the tip ends of first dummy electrodes 422 and second dummy electrodes 522. Consequently, characteristics variation due to manufacturing variation of elastic wave element 309 can be suppressed. Furthermore, since there is no boundary between a part in which first dielectric film 10 is formed and a part in which first dielectric film 10 is not formed in alternately disposed region 9 of IDT electrode 3, deterioration of characteristics in elastic wave element 309 can be suppressed. Note here that FIGS. 9A and 9B show a cross section of elastic wave element 309 when the thickness of first dielectric film 10 is smaller than that of IDT electrode 3. On the other hand, FIGS. 10A and 10B show elastic wave element 310 when the thickness of first dielectric film 10 is larger than that of IDT electrode 3. Also in this case, the above-mentioned effect can be obtained.

Figure 11A:
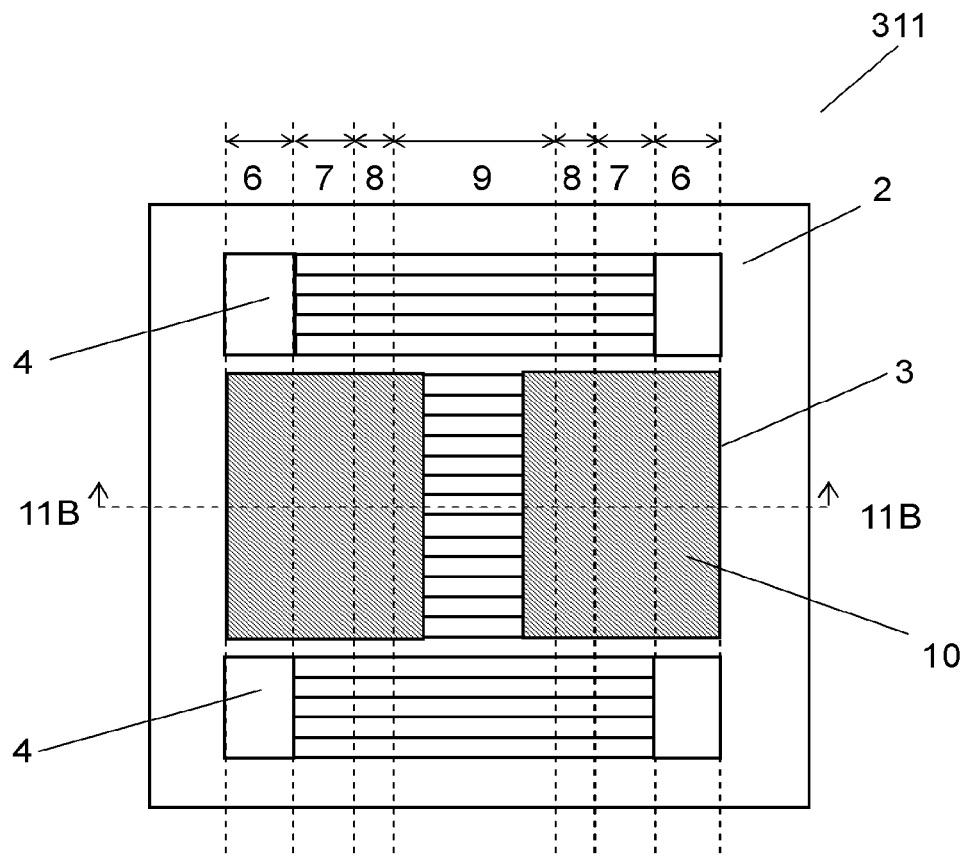
FIG. 11A is a top schematic view of a further elastic wave element in accordance with the first exemplary embodiment of the present invention.
Figure 11B:
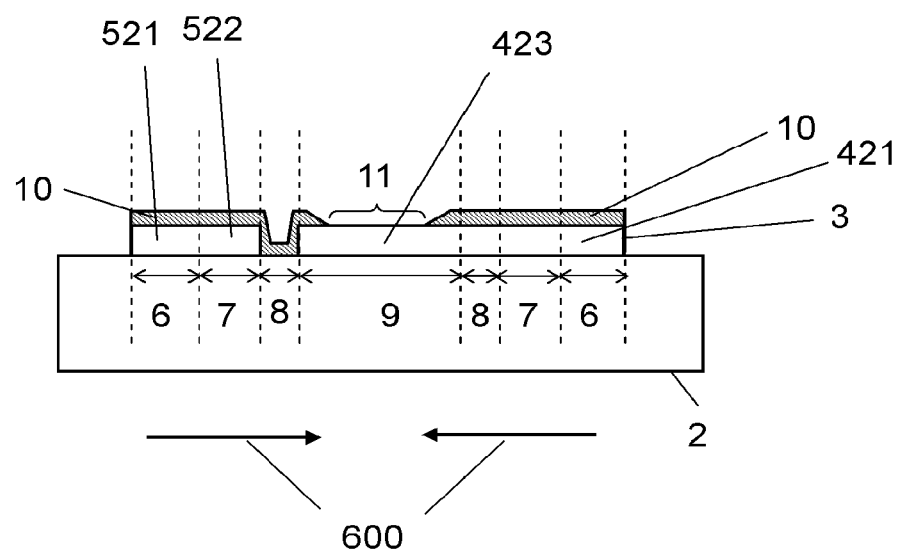
FIG. 11B is a sectional schematic view taken on line 11B-11B of FIG. 11A.
Figure 12A:
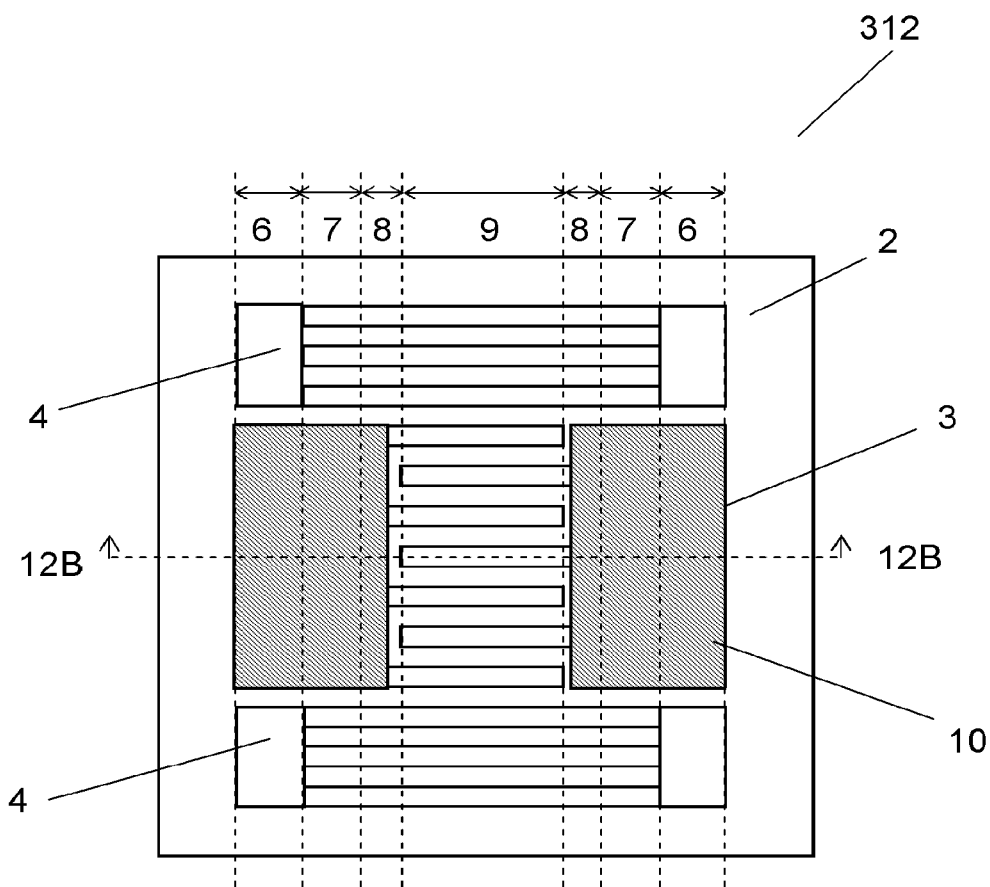
FIG. 12A is a top schematic view of a further elastic wave element in accordance with the first exemplary embodiment of the present invention.
Figure 12B:
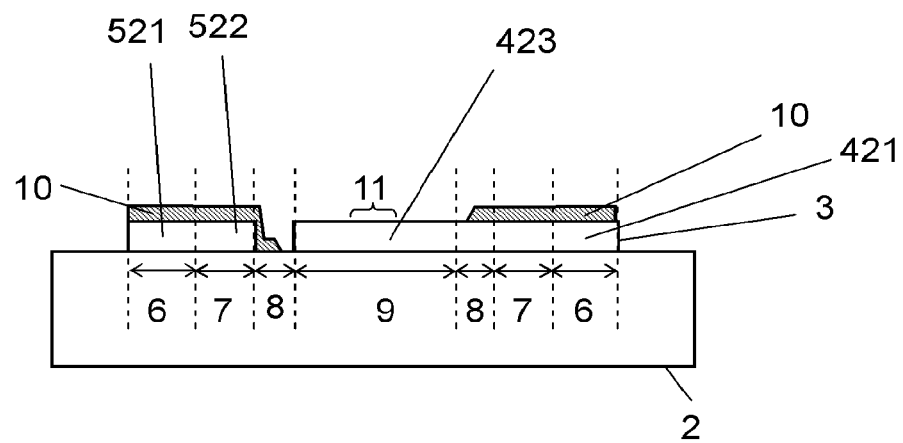
FIG. 12B is a sectional schematic view taken on line 12B-12B of FIG. 12A.
Figure 13A:
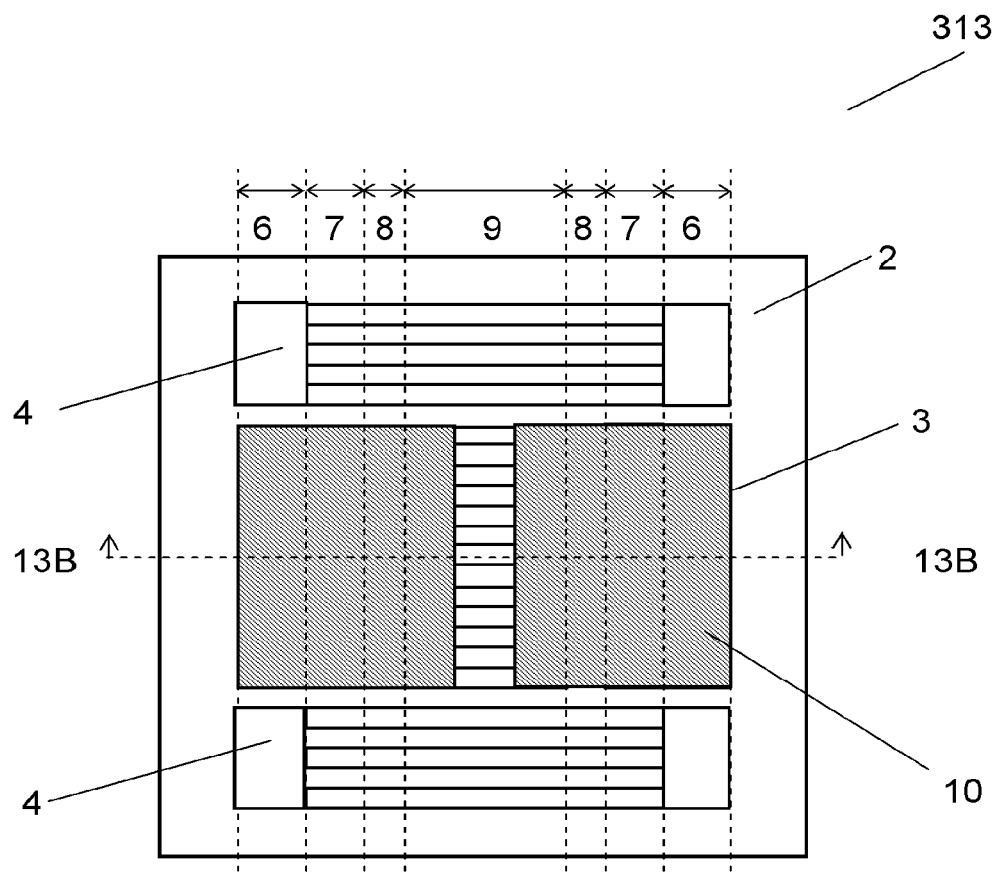
FIG. 13A is a top schematic view of a further elastic wave element in accordance with the first exemplary embodiment of the present invention.
Figure 13B:
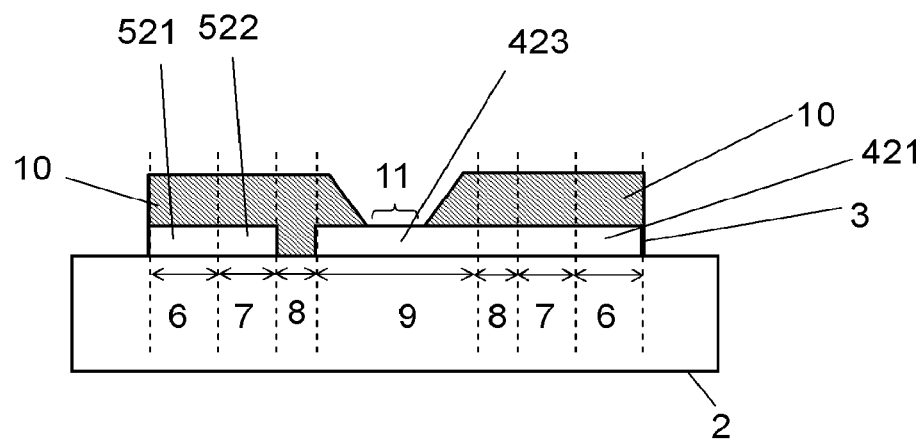
FIG. 13B is a sectional schematic view taken on line 13B-13B of FIG. 13A.
Figure 14A:
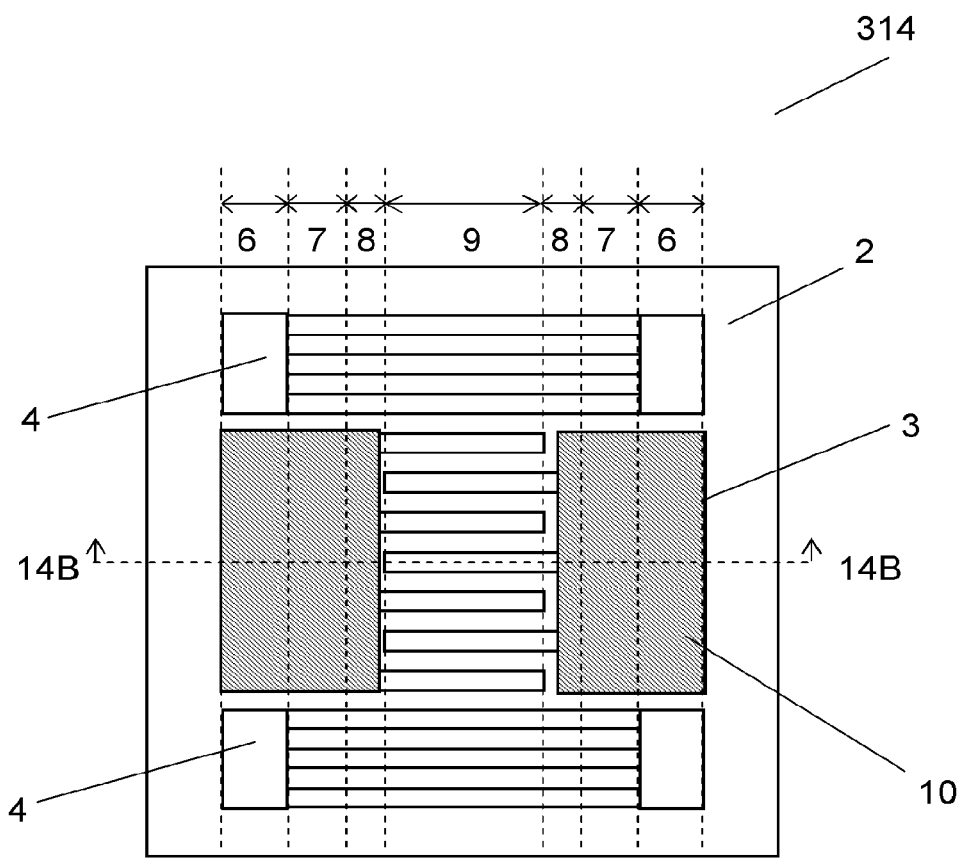
FIG. 14A is a top schematic view of a further elastic wave element in accordance with the first exemplary embodiment of the present invention.
Figure 14B:
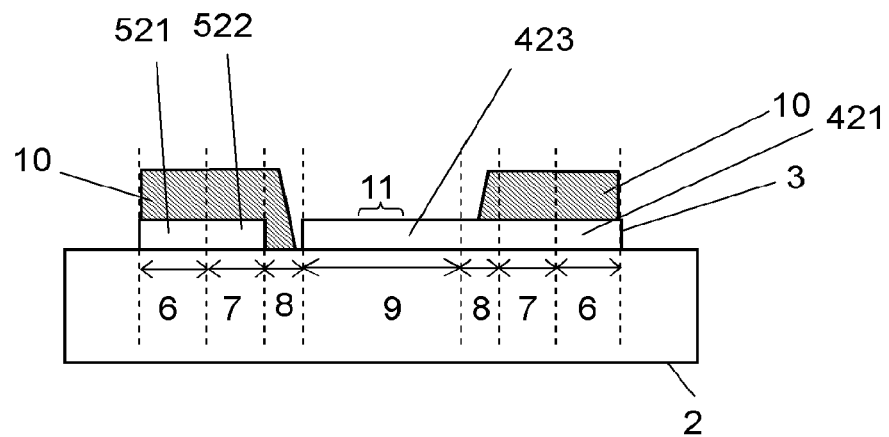
FIG. 14B is a sectional schematic view taken on line 14B-14B of FIG. 14A.
Figure 15A:
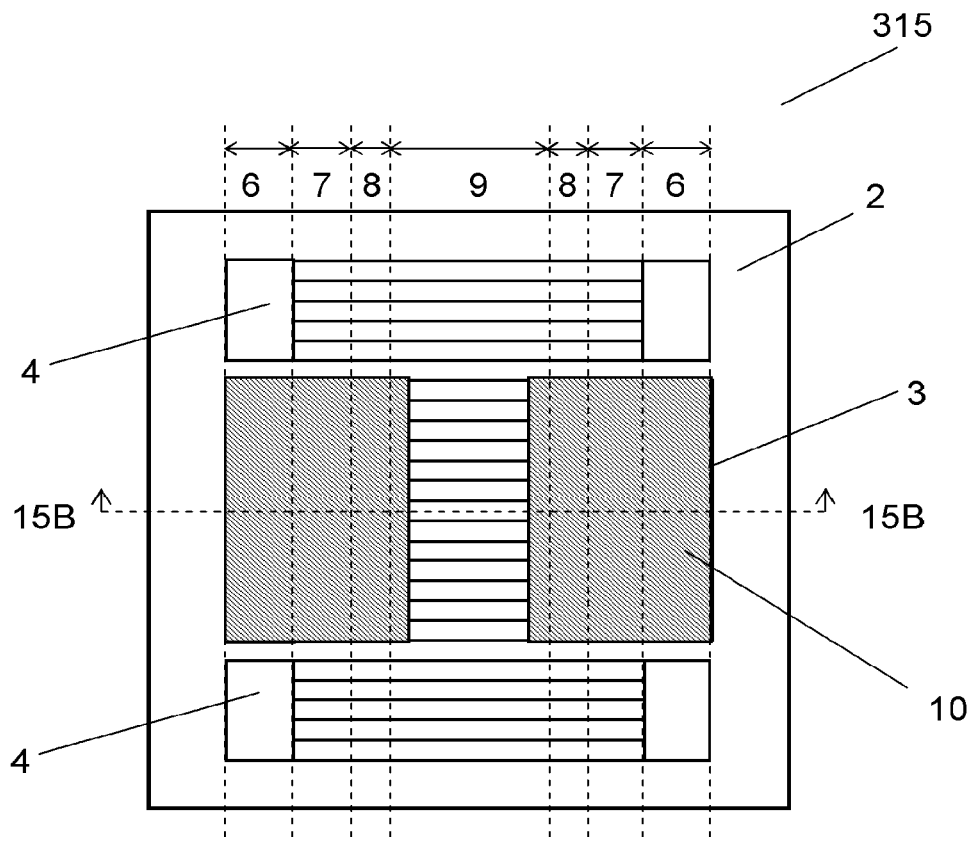
FIG. 15A is a top schematic view of a further elastic wave element in accordance with the first exemplary embodiment of the present invention.
Figure 15B:
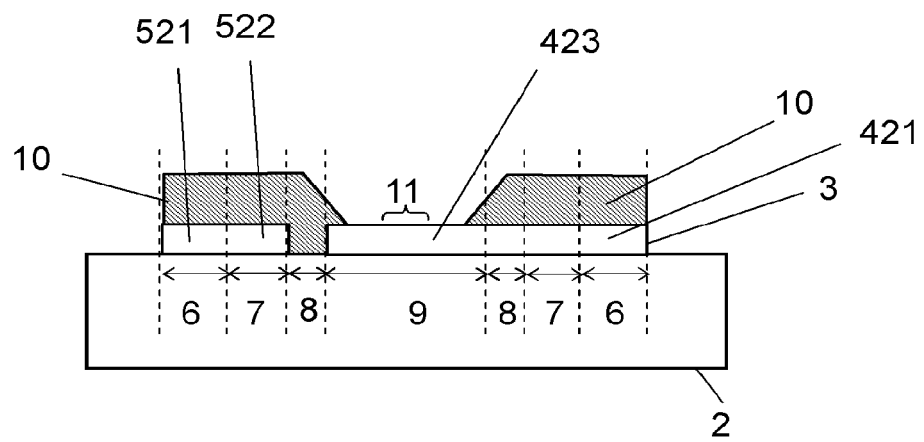
FIG. 15B is a sectional schematic view taken on line 15B-15B of FIG. 15A.

Furthermore, as in elastic wave element 311 shown in FIGS. 11A and 11B, in alternately disposed region 9, the end portion of first dielectric film 10 may have a tapered shape in which a film thickness of first dielectric film 10 is gradually reduced in the direction from bus bar electrode region 6 toward the center portion 11 of alternately disposed region 9 (in a direction of arrow 600 of FIG. 11B, that is, in an extending direction of the first and second electrode fingers). Furthermore, as in elastic wave element 312 shown in FIGS. 12A and 12B, in intermediate region 8, the end portion of first dielectric film 10 may have a tapered shape in which the film thickness of first dielectric film 10 is gradually reduced in the direction toward center portion 11 of alternately disposed region 9. Note here that FIGS. 11A, 11B, 12A, and 12B show structures of elastic wave elements 311 and 312 when the thickness of first dielectric film 10 is smaller than that of IDT electrode 3. However, when the thickness of first dielectric film 10 is larger than that of IDT electrode 3, elastic wave elements 311 and 312 are respectively, for example, elastic wave elements 313 and 314 shown in FIGS. 13A, 13B, 14A and 14B. Furthermore, as in elastic wave element 315 shown in FIGS. 15A and 15B, the end portion of first dielectric film 10 may have a tapered shape in which the height from the upper surface of piezoelectric substrate 2 to the upper surface of first dielectric film 10 is gradually reduced from intermediate region 8 to alternately disposed region 9.

In this way, when the end portion of first dielectric film 10 is formed in a tapered shape, a rapid change in the acoustic velocity of the main elastic wave in the boundary between the part in which first dielectric film 10 is formed and the part in which first dielectric film 10 is not formed can be suppressed. As a result, unnecessary spurious can be suppressed.

Second Exemplary Embodiment

Figure 16A:
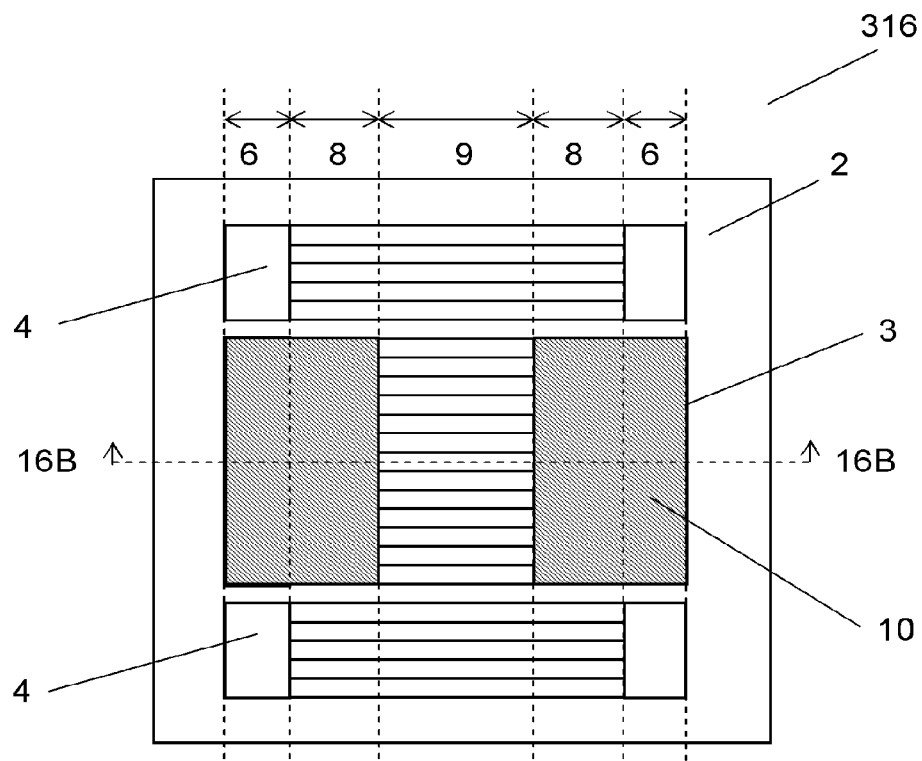
FIG. 16A is a top schematic view of an elastic wave element in accordance with a second exemplary embodiment of the present invention.
Figure 16B:
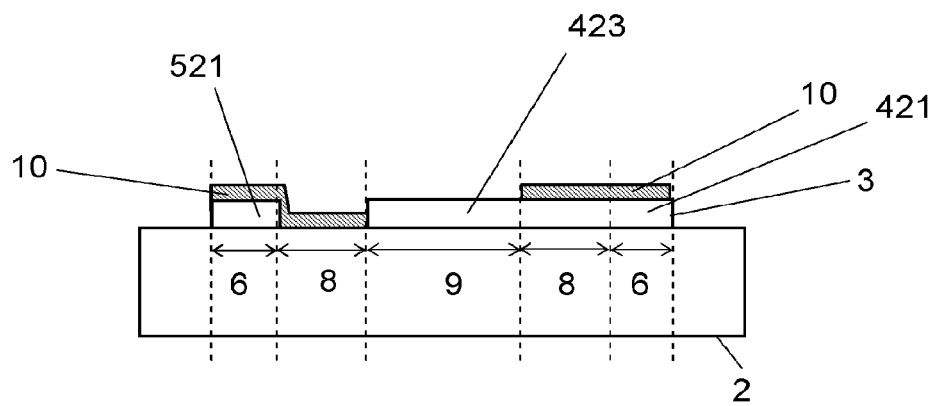
FIG. 16B is a sectional schematic view taken on line 16B-16B of FIG. 16A.

FIG. 16A is a top schematic view of an elastic wave element in accordance with a second exemplary embodiment of the present invention. FIG. 16B is a sectional schematic view taken on line 16B-16B (in an extending direction of electrode fingers) of FIG. 16A.

Figure 16C:
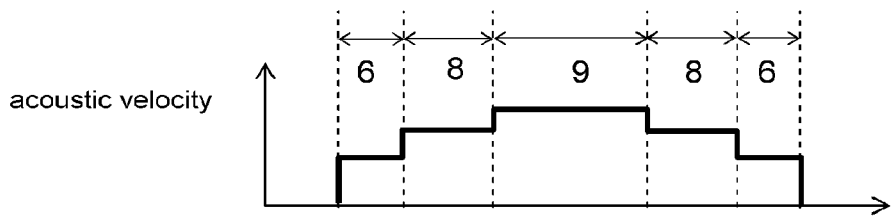
FIG. 16C is a graph showing acoustic velocity of a main elastic wave of FIG. 16B.
Figure 16D:
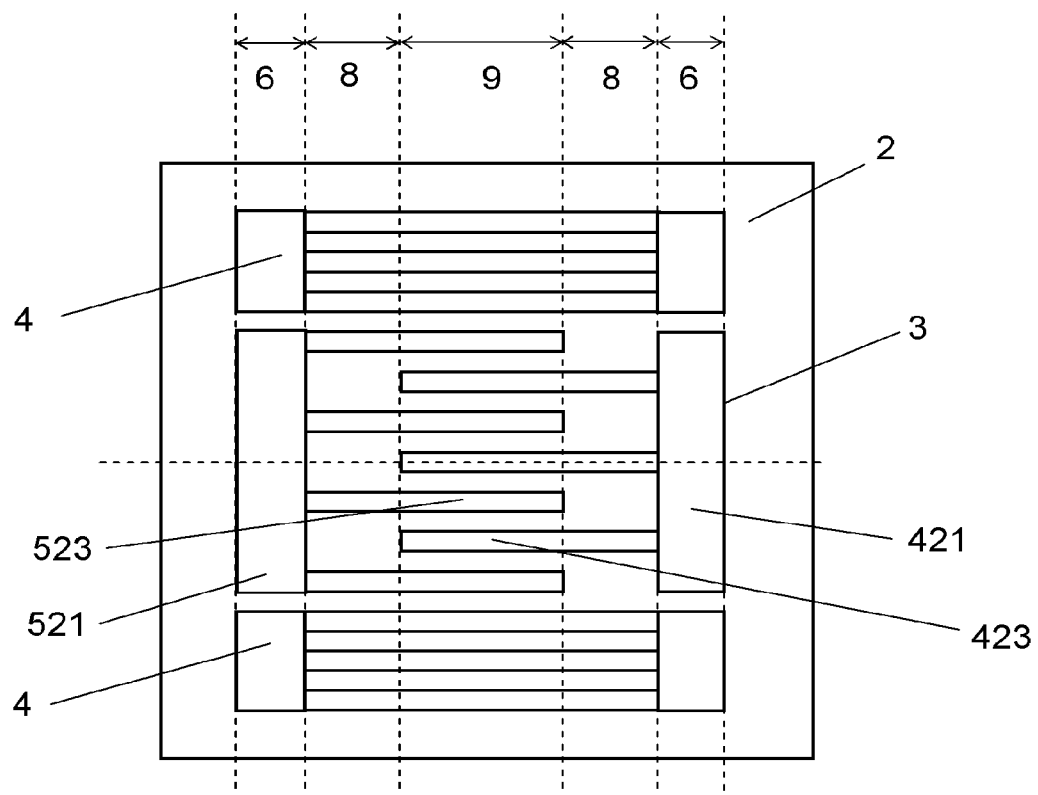
FIG. 16D is a top schematic view showing configurations of a piezoelectric substrate, an IDT electrode, and a reflector electrode in accordance with the second exemplary embodiment of the present invention.

FIG. 16C is a graph showing acoustic velocity of a main elastic wave in FIG. 16B. FIG. 16D is a top schematic view showing configurations of a piezoelectric substrate, an IDT electrode, and a reflector electrode in accordance with the second exemplary embodiment of the present invention.

The second exemplary embodiment is different from first exemplary embodiment in that IDT electrode 3 does not include the dummy electrodes, and dummy electrode region 7 is not present as shown in FIGS. 16A and 16B.

Also with the above-mentioned configuration, as shown in FIG. 16C, a difference between acoustic velocity of a main elastic wave in intermediate region 8 and acoustic velocity of a main elastic wave in alternately disposed region 9 can be reduced. That is to say, the acoustic velocity of the main elastic wave in intermediate region 8 can be lower than the acoustic velocity of the main elastic wave in alternately disposed region 9. Therefore, it is possible to suppress leakage of the main elastic wave of alternately disposed region 9 into intermediate region 8. As a result, characteristic loss of elastic wave element 316 can be reduced.

Figure 17A:
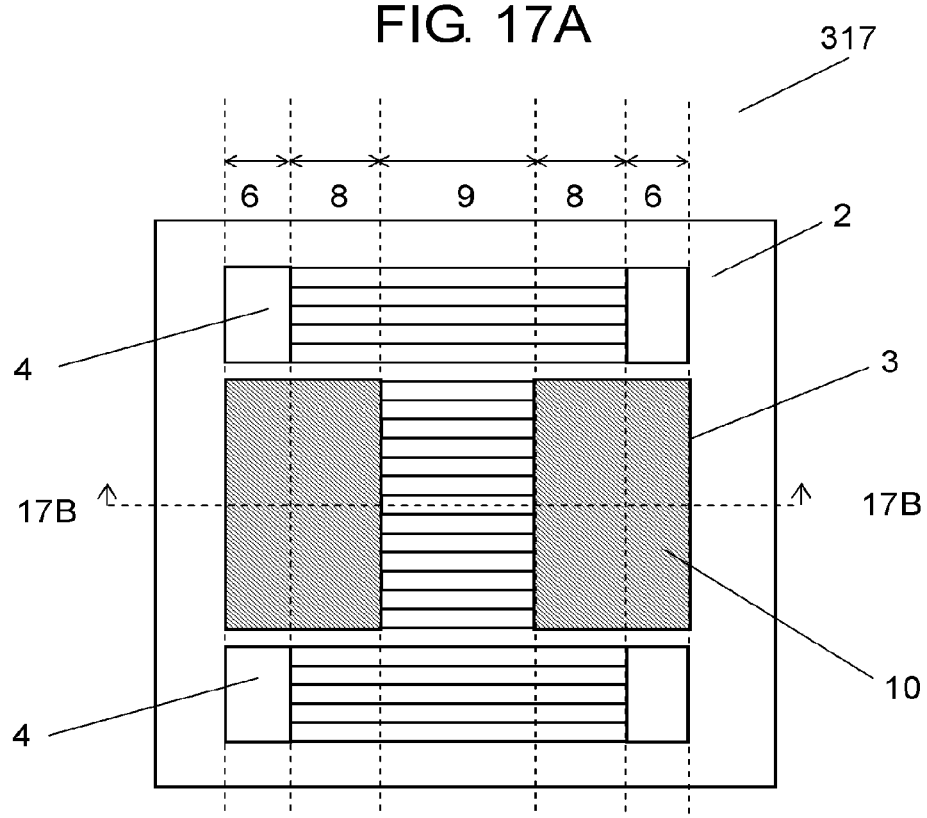
FIG. 17A is a top schematic view of another elastic wave element in accordance with the second exemplary embodiment of the present invention.
Figure 17B:
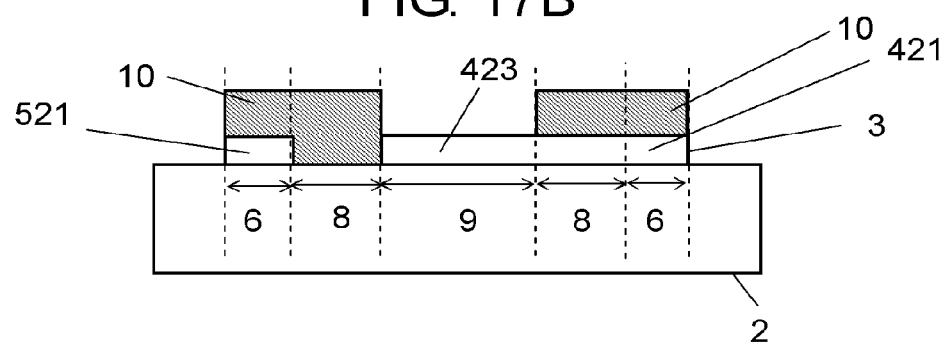
FIG. 17B is a sectional schematic view taken on line 17B-17B of FIG. 17A.
Figure 17C:
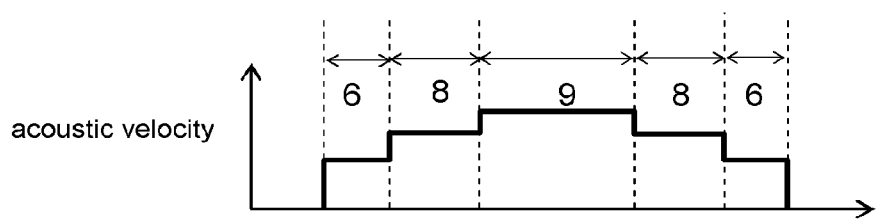
FIG. 17C is a graph showing acoustic velocity of a main elastic wave of FIG. 17B.

FIGS. 16A to 16D show a case where a thickness of first dielectric film 10 is smaller than that of IDT electrode 3. On the other hand, FIGS. 17A and 17B show a structure of elastic wave element 317 when the thickness of first dielectric film 10 is larger than that of IDT electrode 3 and FIG. 17C shows characteristics thereof. Also in this case, leakage of the main elastic wave of alternately disposed region 9 into intermediate region 8 can be suppressed.

Furthermore, as in this exemplary embodiment, in a configuration without including dummy electrode region 7, as shown in FIGS. 7A, 7B, 8A, and 8B, first dielectric film 10 may be formed in a predetermined region from the end portion of intermediate region 8 side to the inner side of alternately disposed region 9 in alternately disposed region 9 of IDT electrode 3.

Furthermore, as in this exemplary embodiment, in a configuration without including dummy electrode region 7, as shown in FIGS. 9A, 9B, 10A, and 10B, first dielectric film 10 may not be formed in a predetermined region from the end portion of alternately disposed region 9 to intermediate region 8 in intermediate region 8 of IDT electrode 3.

Furthermore, as in this exemplary embodiment, in a configuration without including dummy electrode region 7, as shown in FIGS. 11A to 15B, the end portion of first dielectric film 10 may have a tapered shape in which the film thickness of first dielectric film 10 is gradually reduced in the direction from bus bar electrode region 6 to center portion 11 of alternately disposed region 9.

Furthermore, in this exemplary embodiment, first dielectric film 10 is formed in bus bar electrode region 6 but first dielectric film 10 may not be formed in bus bar electrode region 6.

Third Exemplary Embodiment

Figure 18A:
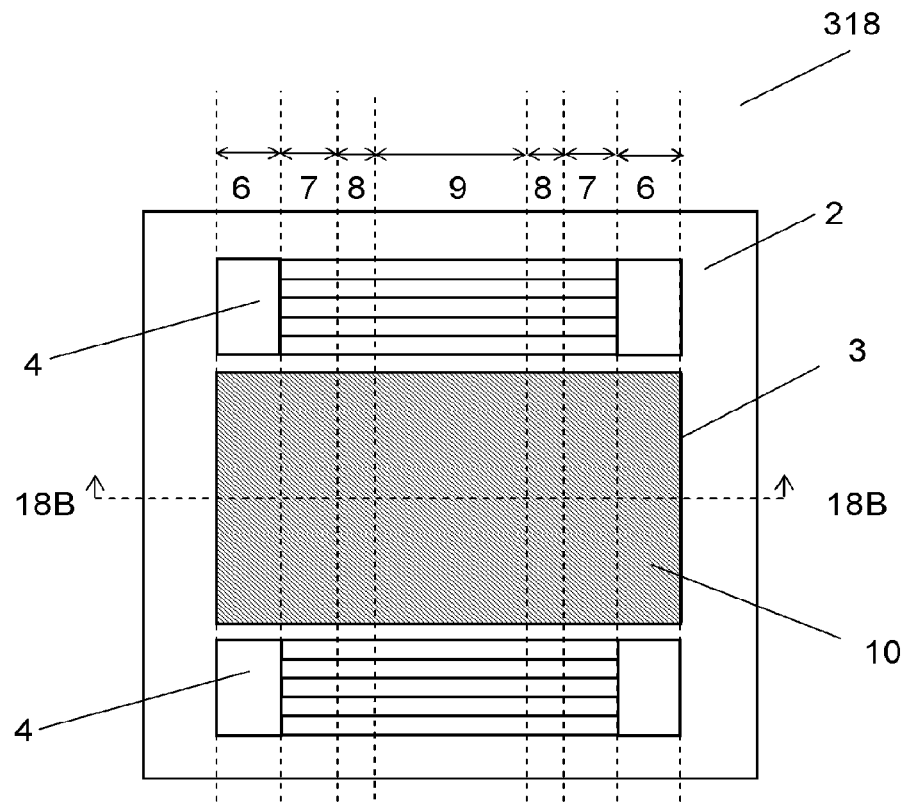
FIG. 18A is a top schematic view of an elastic wave element in accordance with a third exemplary embodiment of the present invention.
Figure 18B:
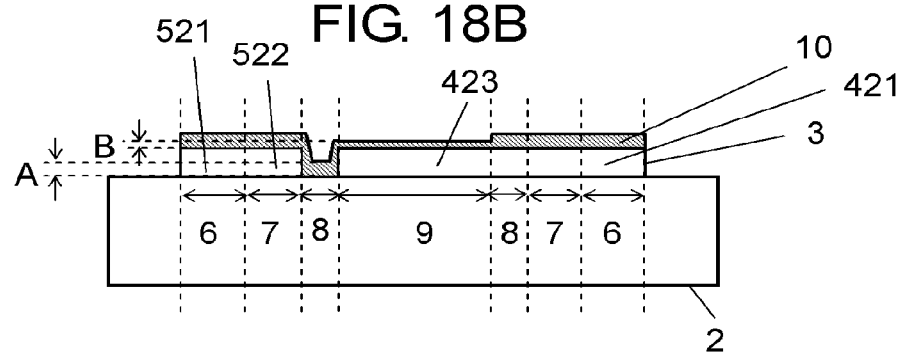
FIG. 18B is a sectional schematic view taken on line 18B-18B of FIG. 18A.
Figure 18C:
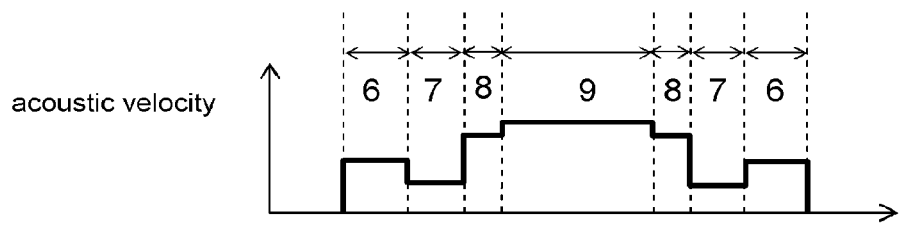
FIG. 18C is a graph showing acoustic velocity of a main elastic wave of FIG. 18B.

FIG. 18A is a top schematic view of an elastic wave element in accordance with a third exemplary embodiment of the present invention. FIG. 18B is a sectional schematic view taken on line 18B-18B (in an extending direction of electrode fingers) of FIG. 18A. FIG. 18C is a graph showing acoustic velocity of a main elastic wave of FIG. 18B. In this exemplary embodiment, configurations of piezoelectric substrate 2, IDT electrode 3 and reflector electrode 4 are the same as those in FIG. 1D.

The third exemplary embodiment is different from first exemplary embodiment in that first dielectric film 10 is formed also in alternately disposed region 9 and that the film thickness of first dielectric film 10 in alternately disposed region 9 is smaller than that of first dielectric film 10 in intermediate region 8 as shown in FIGS. 18A and 18B.

Also with the above-mentioned configuration, as shown in FIG. 18C, a difference between acoustic velocity of a main elastic wave in intermediate region 8 and acoustic velocity of a main elastic wave in alternately disposed region 9 can be reduced. That is to say, the acoustic velocity of the main elastic wave in intermediate region 8 can be lower than the acoustic velocity of the main elastic wave in alternately disposed region 9. Therefore, it is possible to suppress leakage of the main elastic wave of alternately disposed region 9 into intermediate region 8. As a result, characteristic loss of elastic wave element 318 can be reduced.

Figure 19A:
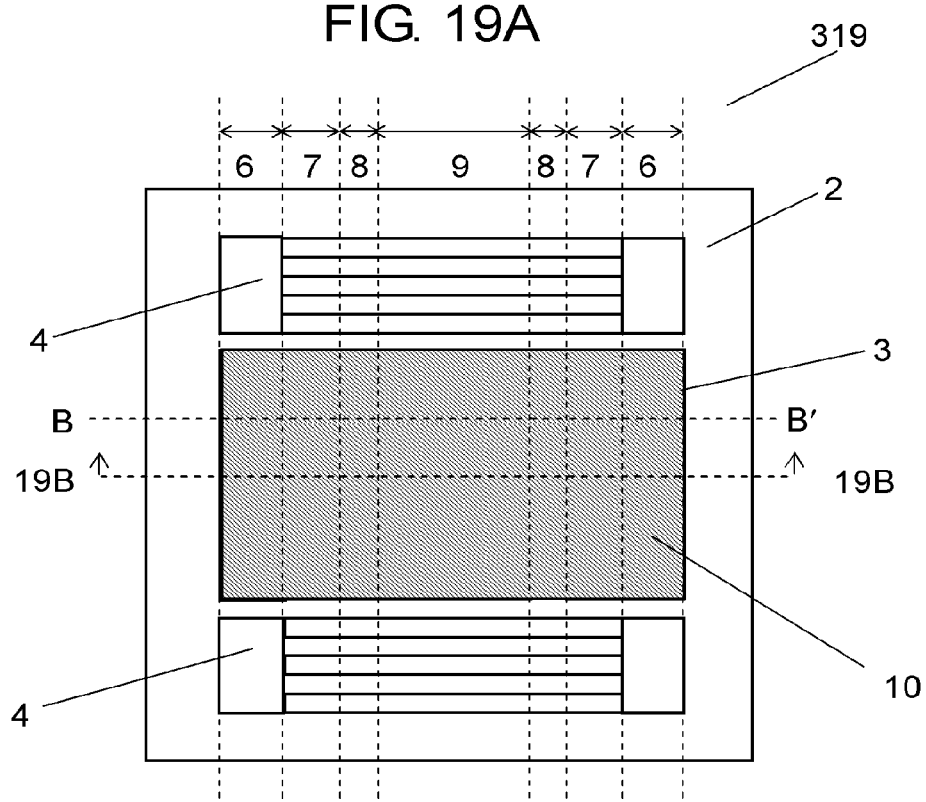
FIG. 19A is a top schematic view of another elastic wave element in accordance with the third exemplary embodiment of the present invention.
Figure 19B:
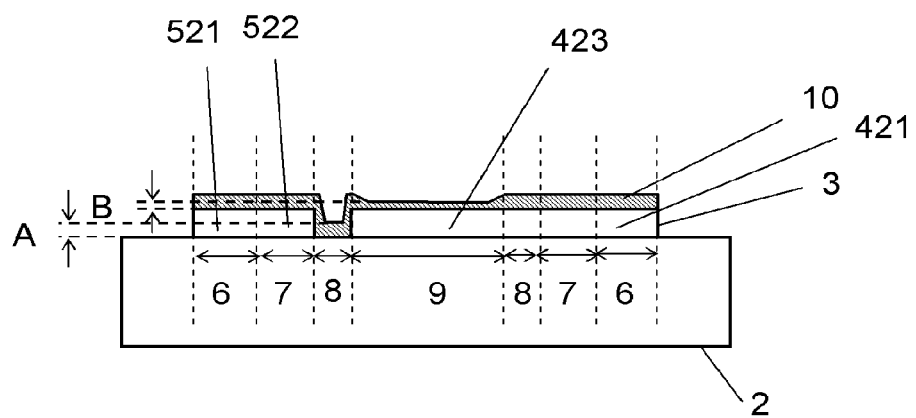
FIG. 19B is a sectional schematic view taken on line 19B-19B of FIG. 19A.
Figure 20A:
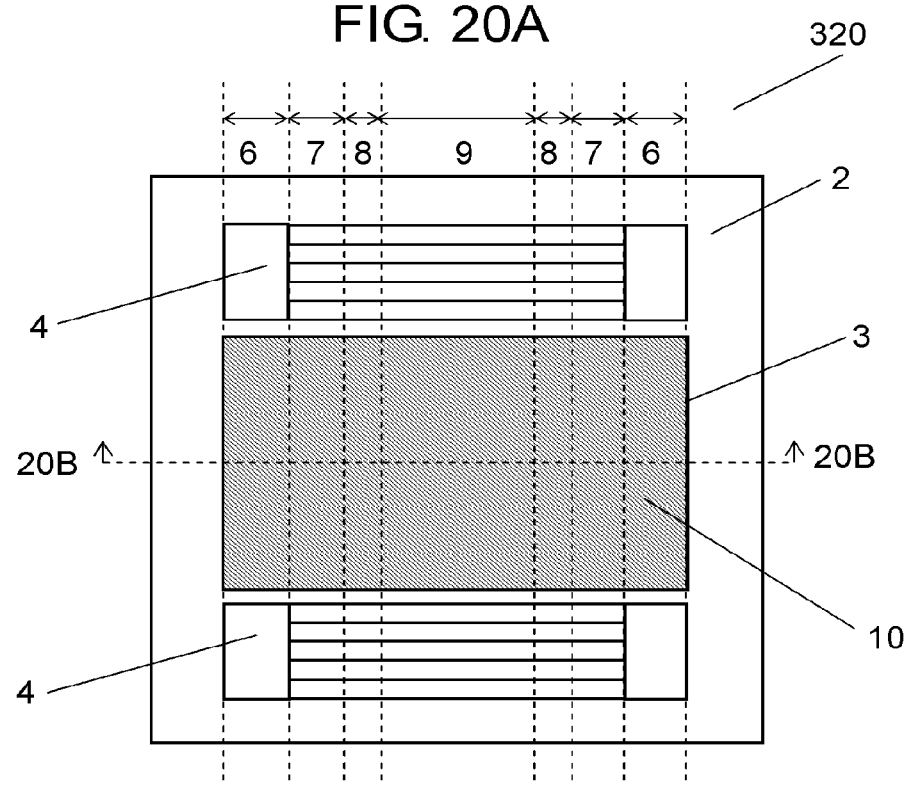
FIG. 20A is a top schematic view of still another elastic wave element in accordance with the third exemplary embodiment of the present invention.
Figure 20B:
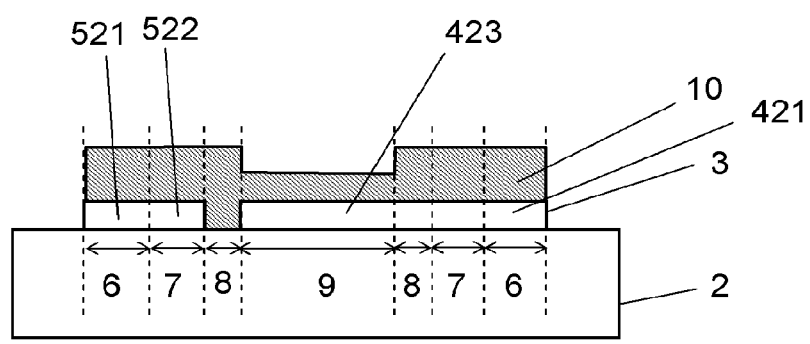
FIG. 20B is a sectional schematic view taken on line 20B-20B of FIG. 20A.
Figure 20C:
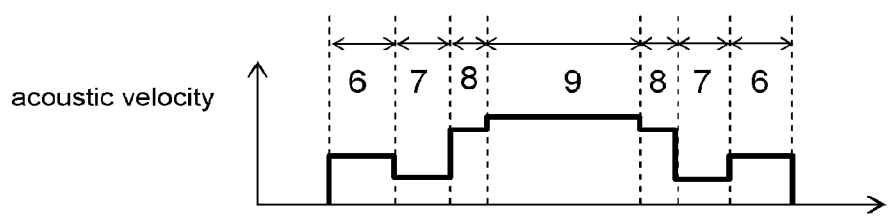
FIG. 20C is a graph showing acoustic velocity of a main elastic wave of FIG. 20B.
Figure 21A:
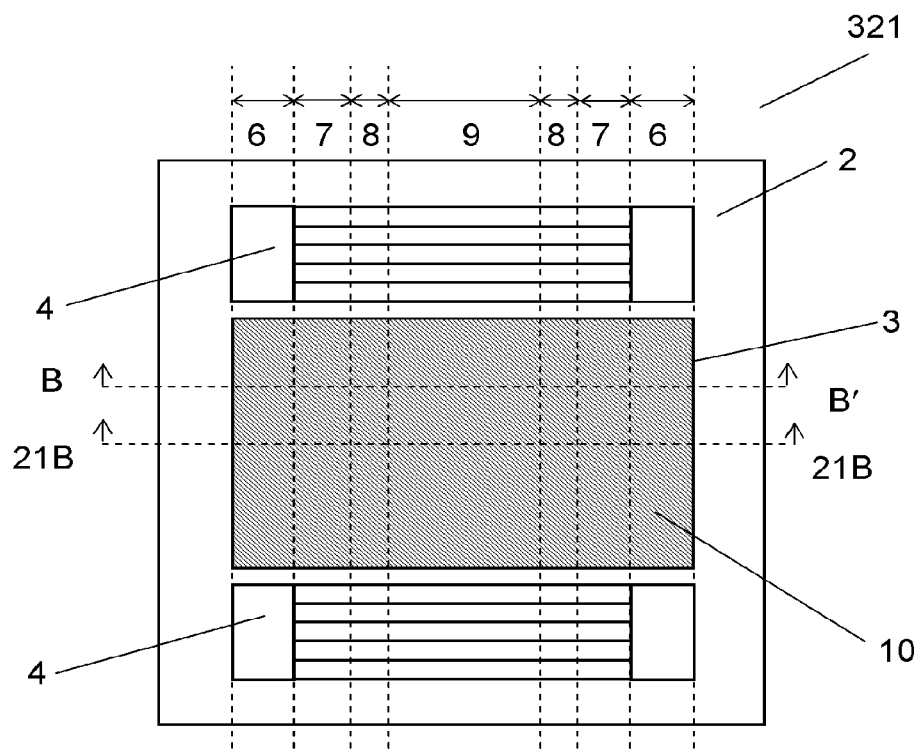
FIG. 21A is a top schematic view of yet another elastic wave element in accordance with the third exemplary embodiment of the present invention.
Figure 21B:
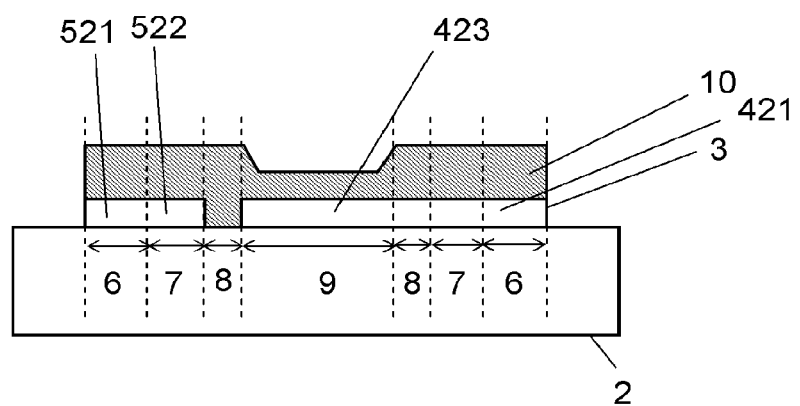
FIG. 21B is a sectional schematic view taken on line 21B-21B of FIG. 21A.

As in elastic wave element 319 shown in FIGS. 19A and 19B, a height from the upper surface of piezoelectric substrate 2 to the upper surface of first dielectric film 10 may be gradually reduced in the direction from intermediate region 8 to the center of alternately disposed region 9. That is to say, a stepped portion made by a difference between a height from the upper surface of piezoelectric substrate 2 to the upper surface of first dielectric film 10 in alternately disposed region 9 and a height from the upper surface of piezoelectric substrate 2 to the upper surface of first dielectric film 10 in intermediate region 8 may be formed in a tapered shape. With this configuration, a rapid change in the acoustic velocity of the main elastic wave in the stepped portion of first dielectric film 10 can be suppressed. As a result, generation of unnecessary spurious can be suppressed. Note here that in elastic wave element 319 in the third exemplary embodiment, also in a B-B' cross section (in a cross section between the electrode fingers of IDT electrode 3 in the extending direction of electrode fingers) of FIG. 19A, the film thickness of first dielectric film 10 in alternately disposed region 9 is smaller than the film thickness of first dielectric film 10 in intermediate region 8.

Furthermore, the height from the upper surface of piezoelectric substrate 2 to the upper surface of first dielectric film 10 in alternately disposed region 9 is lower than the height from the upper surface of piezoelectric substrate 2 to the upper surface of first dielectric film 10 in intermediate region 8. Therefore, it is possible to further suppress leakage of the main elastic wave of alternately disposed region 9 into intermediate region 8. As a result, characteristic loss of elastic wave element 319 can be further reduced.

Note here that FIGS. 18A, 18B, 19A, and 19B show structures of elastic wave elements 318 and 319 when the thickness of first dielectric film 10 is smaller than the thickness of IDT electrode 3. However, when the thickness of first dielectric film 10 larger than the thickness of IDT electrode 3, structures and characteristics are those shown in, for example, elastic wave elements 320 and 321 in FIGS. 20A to 20C, 21A, and 21B. Also in this case, the above-mentioned effect can be obtained.

Fourth Exemplary Embodiment

Figure 22A:
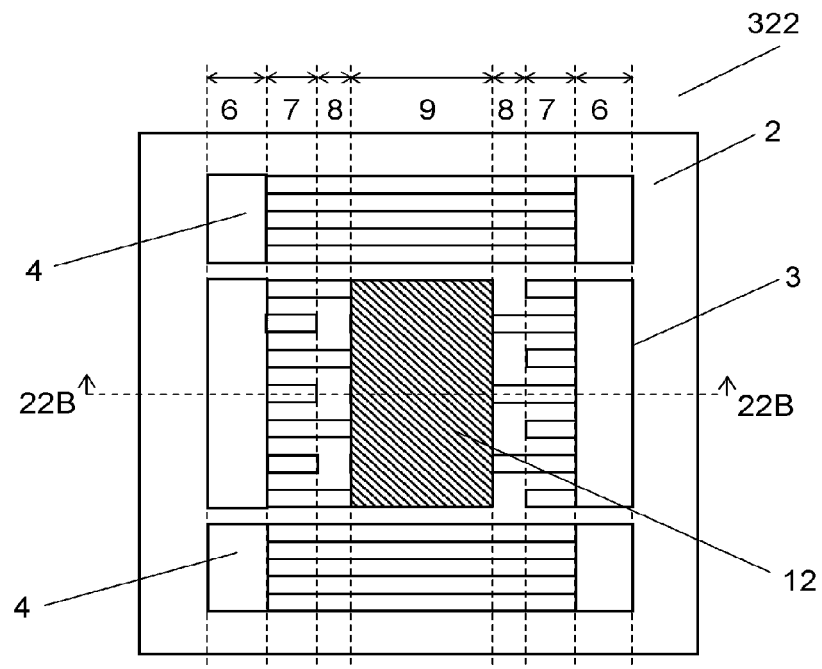
FIG. 22A is a top schematic view of an elastic wave element in accordance with a fourth exemplary embodiment of the present invention.
Figure 22B:
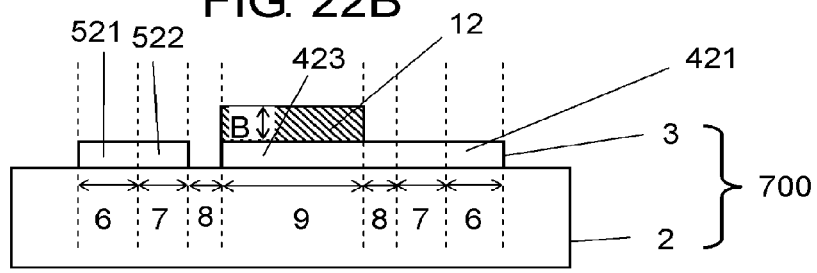
FIG. 22B is a sectional schematic view taken on line 22B-22B of FIG. 22A.
Figure 22C:
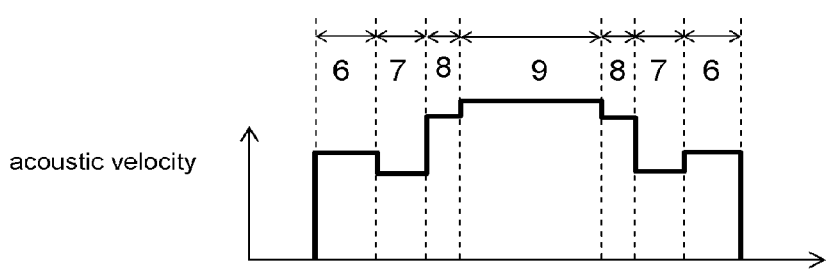
FIG. 22C is a graph showing acoustic velocity of a main elastic wave of FIG. 22B.

FIG. 22A is a top schematic view of elastic wave element 322 in accordance with a fourth exemplary embodiment of the present invention. FIG. 22B is a sectional schematic view taken on line 22B-22B (in an extending direction of electrode fingers) of FIG. 22A. FIG. 22C is a graph showing acoustic velocity of a main elastic wave of FIG. 22B. In this exemplary embodiment, configurations of piezoelectric substrate 2, IDT electrode 3, and reflector electrode 4 are the same as those in FIG. 1D. Piezoelectric substrate 2 is, for example, a lithium tantalate substrate in which an anisotropy index $\gamma$ in the propagation direction satisfies $\gamma<0$.

The fourth exemplary embodiment is different from first exemplary embodiment in that first dielectric film 10 is not formed, and second dielectric film 12 is formed in alternately disposed region 9. Furthermore, second dielectric film 12 is formed of a medium in which acoustic velocity of a transverse wave propagating in second dielectric film 12 is higher than acoustic velocity of a main elastic wave intermediate region 8.

Furthermore, second dielectric film 12 is formed in alternately disposed region 9, and is not formed in intermediate region 8. That is to say, IDT electrode 3 is exposed in intermediate region 8, dummy electrode region 7, and bus bar electrode region 6. That is to say, second dielectric film 12 is formed along the extending direction of the first and second electrode fingers in alternately disposed region 9 and on the uppermost surface of laminated body 700 including piezoelectric substrate 2 and IDT electrode 3.

Second dielectric film 12 is made of, for example, silicon nitride ($Si_3N_4$), aluminum nitride (AlN), aluminum oxide ($Al2O_3$), diamond (C), silicon (Si), or the like. However, material is not necessarily limited thereto, any material may be employed as long as it is insulating media in which the acoustic velocity of the transverse wave propagating second dielectric film 12 is higher than the acoustic velocity of the main elastic wave of intermediate region 8. In particular, aluminum nitride is a medium in which the acoustic velocity of the transverse wave is sufficiently higher than the acoustic velocity of the main elastic wave of intermediate region 8, and therefore it is preferable as second dielectric film 12.

With the above-mentioned configuration, as shown in FIG. 22C, the difference between the acoustic velocity of the main elastic wave in intermediate region 8 and the acoustic velocity of the main elastic wave in alternately disposed region 9 can be reduced. That is to say, the acoustic velocity of the main elastic wave in alternately disposed region 9 can be made to be higher than the acoustic velocity of the main elastic wave in intermediate region 8. Therefore, leakage of the main elastic wave of alternately disposed region 9 into intermediate region 8 can be suppressed. As a result, characteristic loss of elastic wave element 322 can be reduced.

When second dielectric film 12 is made of silicon nitride or aluminum oxide, as shown in FIG. 22B, when the thickness of first dielectric film 10 is larger than that of IDT electrode 3, an effect of trapping the main elastic wave in alternately disposed region 9 can be sufficiently obtained. Specifically, it is desirable that film thickness B of second dielectric film 12 in alternately disposed region 9 is $0.05\lambda$ or more and $1\lambda$ or less. When film thickness B of second dielectric film 12 is less than $0.05\lambda$, the acoustic velocity of the main elastic wave of alternately disposed region 9 cannot be sufficiently increased. When film thickness B of second dielectric film 12 is more than $1\lambda$, characteristics of elastic wave element 322 may be deteriorated.

When second dielectric film 12 is made of aluminum nitride, even when the film thickness of first dielectric film 10 is smaller than the thickness of IDT electrode 3, the above-mentioned effect of trapping the main elastic wave in alternately disposed region 9 can be obtained. Specifically, it is desirable that film thickness B of second dielectric film 12 in alternately disposed region 9 is $0.001\lambda$ or more and $0.1\lambda$ or less. When film thickness B of second dielectric film 12 is less than $0.001\lambda$, the acoustic velocity of the main elastic wave in alternately disposed region 9 cannot be sufficiently reduced. When film thickness B of second dielectric film 12 is larger than $0.1\lambda$, characteristics of elastic wave element 322 may be deteriorated.

Figure 23A:
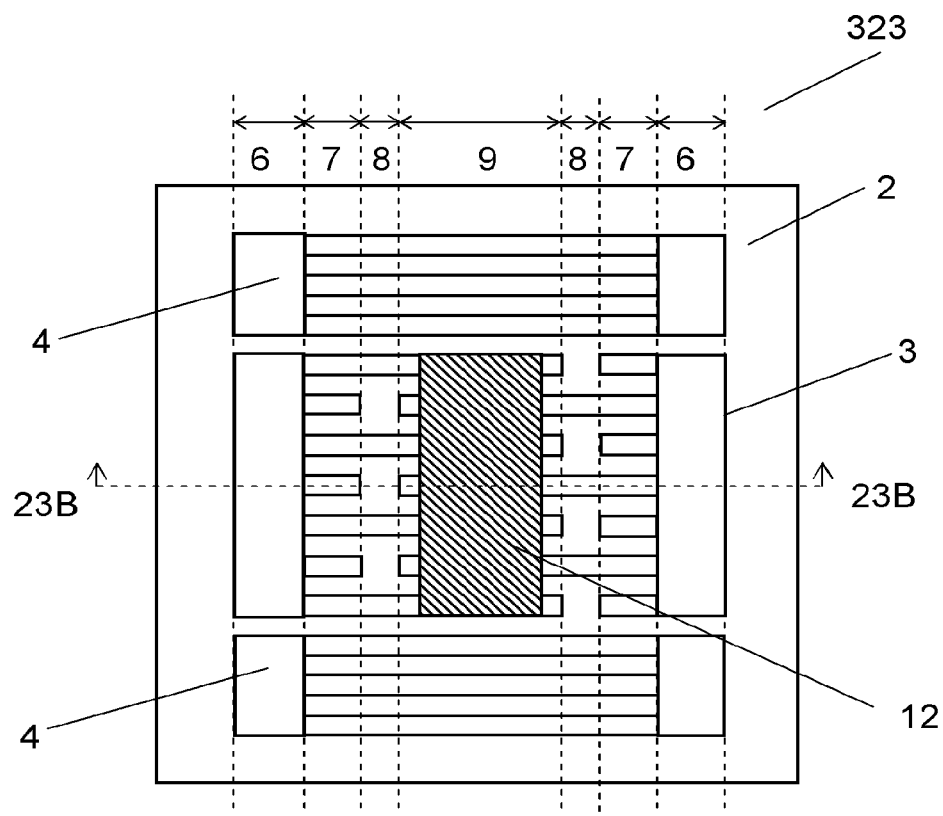
FIG. 23A is a top schematic view of another elastic wave element in accordance with the fourth exemplary embodiment of the present invention.
Figure 23B:
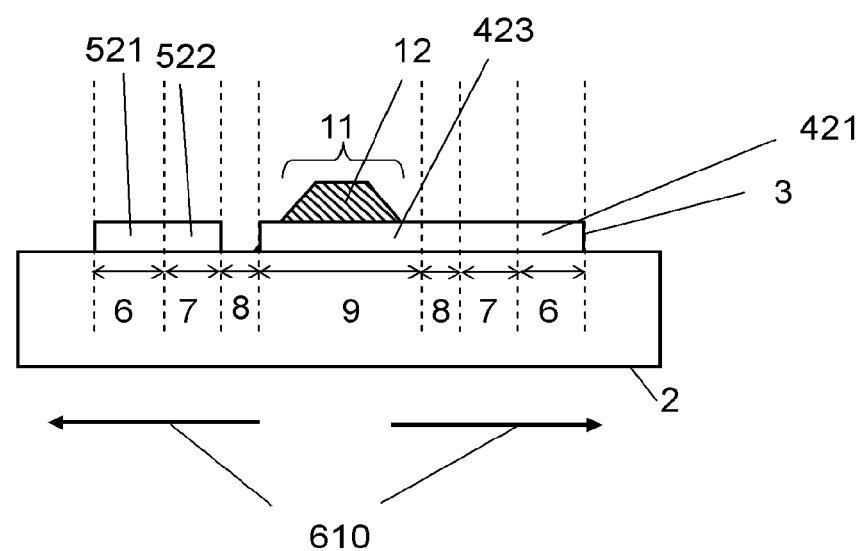
FIG. 23B is a sectional schematic view taken on line 23B-23B of FIG. 23A.

As in elastic wave element 323 shown in FIGS. 23A and 23B, second dielectric film 12 may not be formed in a predetermined region from the end portion at intermediate region 8 side to the inner side of alternately disposed region 9 in alternately disposed region 9 of IDT electrode 3. That is to say, second dielectric film 12 may not be formed in a part of alternately disposed region 9. Second dielectric film 12 may be formed only in center portion 11 of first electrode fingers 423 and second electrode fingers 523 in alternately disposed region 9. In this case, since the end portion of second dielectric film 12 may not be positioned at tip ends of the electrode fingers of IDT electrode 3, characteristics variation due to manufacturing variation of elastic wave element 323 can be suppressed. Furthermore, in elastic wave element 323, a difference between the acoustic velocity of the main elastic wave in intermediate region 8 and the acoustic velocity of the main elastic wave in center portion 11 of alternately disposed region 9 can be reduced. That is to say, the acoustic velocity of the main elastic wave in center portion 11 of alternately disposed region 9 can be made to be higher than the acoustic velocity of the main elastic wave in intermediate region 8. Therefore, the main elastic wave of alternately disposed region 9 is concentrated in center portion 11, so that it is possible to further suppress leakage thereof into intermediate region 8. As a result, characteristic loss of elastic wave element 323 can be reduced.

Figure 24A:
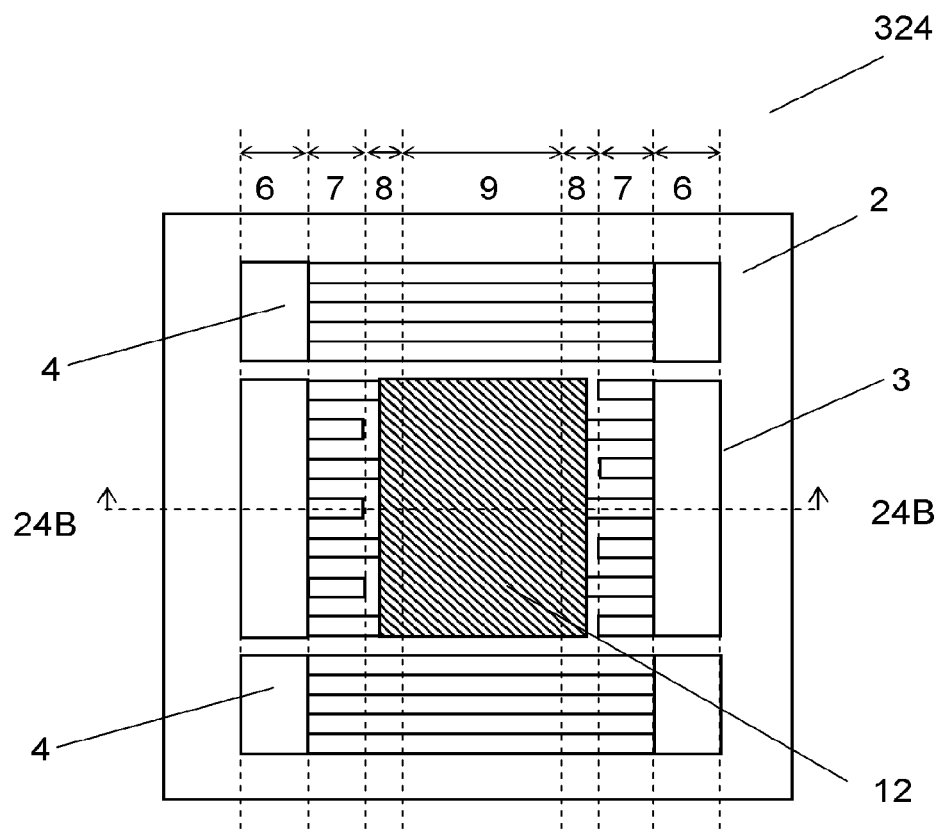
FIG. 24A is a top schematic view of still another elastic wave element in accordance with the fourth exemplary embodiment of the present invention.
Figure 24B:
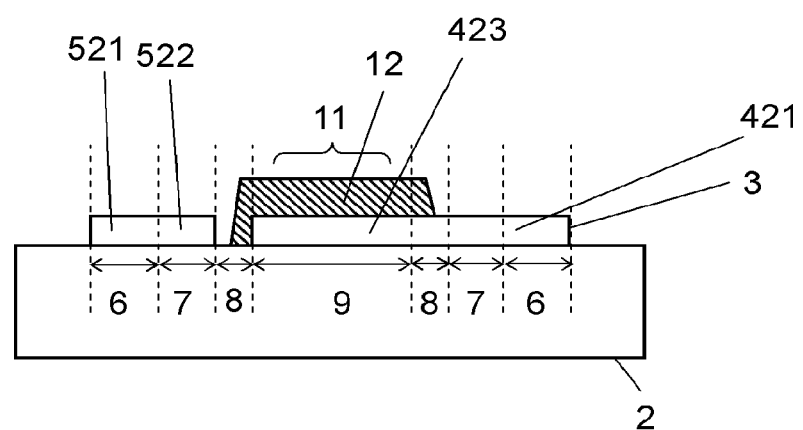
FIG. 24B is a sectional schematic view taken on line 24B-24B of FIG. 24A.

Furthermore, as in elastic wave element 324 shown in FIGS. 24A and 24B, second dielectric film 12 may be formed in a predetermined portion from the end portion of alternately disposed region 9 to intermediate region 8. That is to say, second dielectric film 12 may be formed in a part of intermediate region 8. In this case, the end portion of second dielectric film 12 may not be positioned at tip ends of first electrode fingers 423 and second electrode fingers 523. Consequently, characteristics variation due to manufacturing variation of elastic wave element 324 can be suppressed. Furthermore, since there is no boundary between a part in which second dielectric film 12 is formed and a part in which second dielectric film 12 is not formed in alternately disposed region 9 of IDT electrode 3, deterioration of characteristics of elastic wave element 324 can be suppressed.

As shown in FIGS. 23A, 23B, 24A, and 24B, the end portion of second dielectric film 12 may have a tapered shape in which a film thickness of second dielectric film 12 is gradually reduced in the direction from the center portion 11 of alternately disposed region 9 toward intermediate region 8 (in a direction of arrow 610 of FIG. 23B, that is, in an extending direction of the first and second electrode fingers). In this way, when the end portion of second dielectric film 12 is made to have a tapered shape, a rapid change in the acoustic velocity of the main elastic wave in the boundary between the part on which second dielectric film 12 is formed and the part on which second dielectric film 12 is not formed can be suppressed. As a result, generation of unnecessary spurious can be suppressed.

Fifth Exemplary Embodiment

Figure 25A:
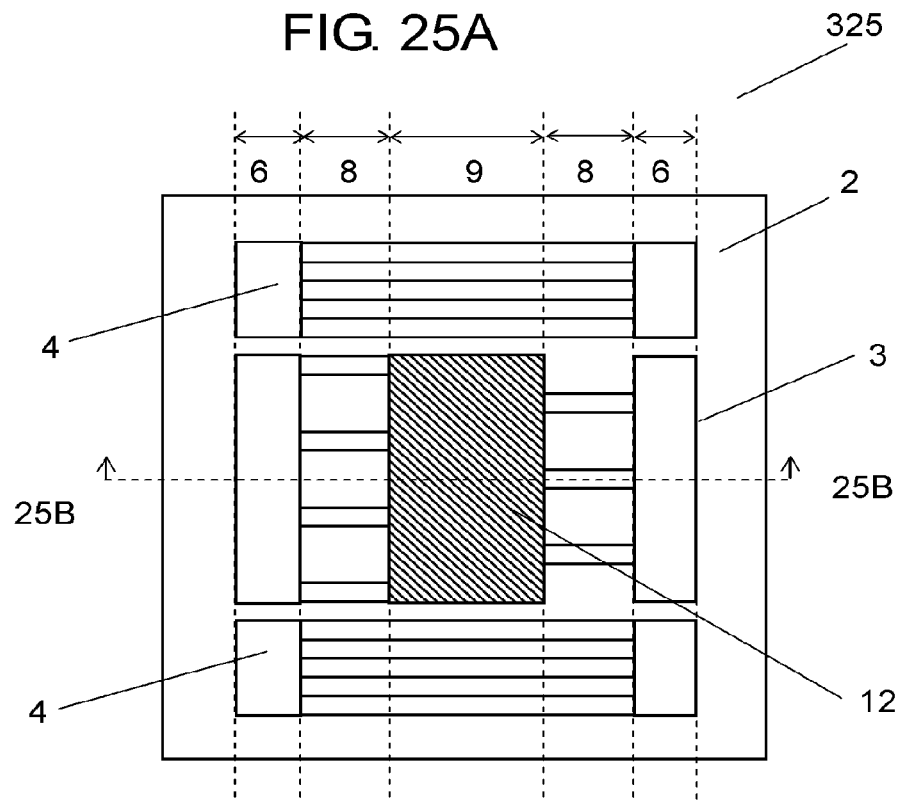
FIG. 25A is a top schematic view of an elastic wave element in accordance with a fifth exemplary embodiment of the present invention.
Figure 25B:
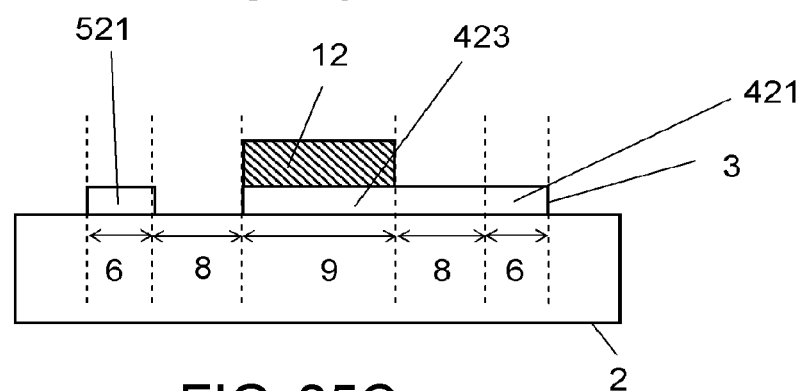
FIG. 25B is a sectional schematic view taken on line 25B-25B of FIG. 25A.
Figure 25C:
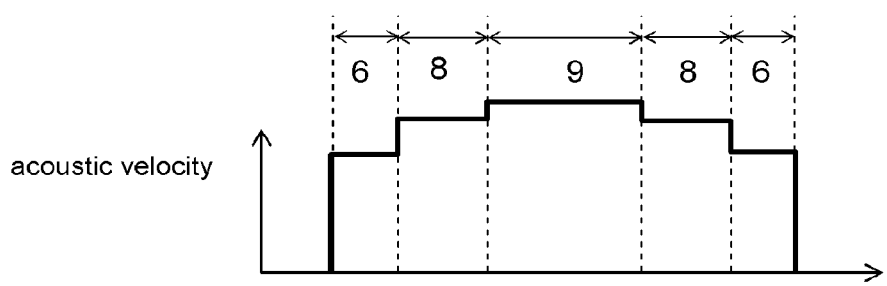
FIG. 25C is a graph showing acoustic velocity of a main elastic wave of FIG. 25B.

FIG. 25A is a top schematic view of elastic wave element 325 in accordance with a fifth exemplary embodiment of the present invention. FIG. 25B is a sectional schematic view taken on line 25B-25B (in an extending direction of electrode fingers) of FIG. 25A. FIG. 25C is a graph showing acoustic velocity of a main elastic wave in FIG. 25B. In this exemplary embodiment, configurations of piezoelectric substrate 2, IDT electrode 3, and reflector electrode 4 are the same as those in FIG. 1D.

The fifth exemplary embodiment is different from fourth exemplary embodiment in that IDT electrode 3 does not include first dummy electrodes 422 and second dummy electrodes 522, and that dummy electrode region 7 is not present.

Also with the above-mentioned configuration, as shown in FIG. 25C, in elastic wave element 325, a difference between acoustic velocity of the main elastic wave in intermediate region 8 and acoustic velocity of a main elastic wave in alternately disposed region 9 can be reduced. That is to say, the acoustic velocity of a main elastic wave in intermediate region 8 can be lower than the acoustic velocity of the main elastic wave in alternately disposed region 9. Consequently, it is possible to suppress leakage of the main elastic wave of alternately disposed region 9 into intermediate region 8. As a result, characteristic loss of elastic wave element 325 can be reduced.

Sixth Exemplary Embodiment

Figure 26A:
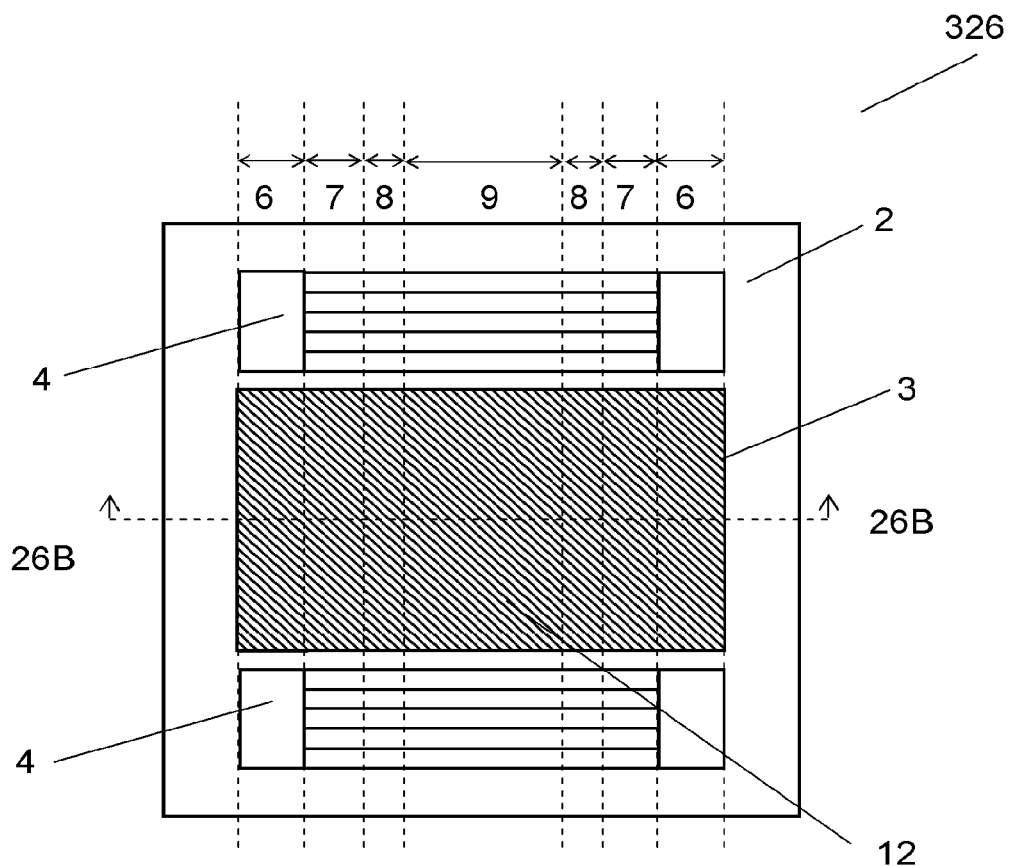
FIG. 26A is a top schematic view of an elastic wave element in accordance with a sixth exemplary embodiment of the present invention.
Figure 26B:
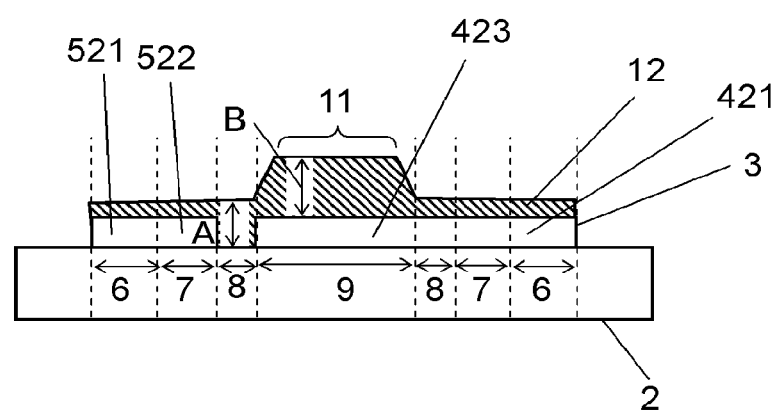
FIG. 26B is a sectional schematic view taken on line 26B-26B of FIG. 26A.

FIG. 26A is a top schematic view of elastic wave element 326 in accordance with a sixth exemplary embodiment of the present invention. FIG. 26B is a sectional schematic view taken on line 26B-26B (in an extending direction of electrode fingers) of FIG. 26A. In this exemplary embodiment, configurations of piezoelectric substrate 2, IDT electrode 3, and reflector electrode 4 are the same as those in FIG. 1D.

The sixth exemplary embodiment is different from the fourth exemplary embodiment in that second dielectric film 12 is formed in at least intermediate region 8. In FIG. 26, second dielectric film 12 is formed in intermediate region 8, dummy electrode region 7, and bus bar electrode region 6, and in that film thickness B of second dielectric film 12 in alternately disposed region 9 is larger than film thickness A of second dielectric film 12 in intermediate region 8.

Also with the above-mentioned configuration, a difference between acoustic velocity of a main elastic wave in intermediate region 8 and acoustic velocity of a main elastic wave in alternately disposed region 9 can be reduced. That is to say, the acoustic velocity of the main elastic wave in alternately disposed region 9 can be higher than the acoustic velocity of the main elastic wave in intermediate region 8. Therefore, it is possible to suppress leakage of the main elastic wave of alternately disposed region 9 into intermediate region 8. As a result, characteristic loss of elastic wave element 326 can be reduced. Furthermore, a height from the upper surface of piezoelectric substrate 2 to the upper surface of second dielectric film 12 in alternately disposed region 9 is higher than a height from the upper surface of piezoelectric substrate 2 to the upper surface of second dielectric film 12 in intermediate region 8. Therefore, furthermore, leakage of the main elastic wave of alternately disposed region 9 into intermediate region 8 can be suppressed. As a result, characteristic loss of elastic wave element 326 can be further reduced.

Furthermore, as shown in FIG. 26B, in alternately disposed region 9 in a configuration of elastic wave element 326, a height from the upper surface of piezoelectric substrate 2 to the upper surface of second dielectric film 12 may be gradually lower in the direction from center portion 11 of alternately disposed region 9 toward intermediate region 8. That is to say, a stepped portion made by the difference between the height from the upper surface of piezoelectric substrate 2 to the upper surface of second dielectric film 12 in alternately disposed region 9, and the height from the upper surface of piezoelectric substrate 2 to the upper surface of second dielectric film 12 in the upper side of intermediate region 8 is made to have a tapered shape. With this configuration, a rapid change in the acoustic velocity of the main elastic wave in the stepped portion of the upper surface of second dielectric film 12 can be suppressed. As a result, generation of unnecessary spurious can be suppressed. Note here that in FIG. 26B, a tapered shape is provided to alternately disposed region 9, but a tapered shape may be provided to intermediate region 8.

Seventh Exemplary Embodiment

Figure 27A:
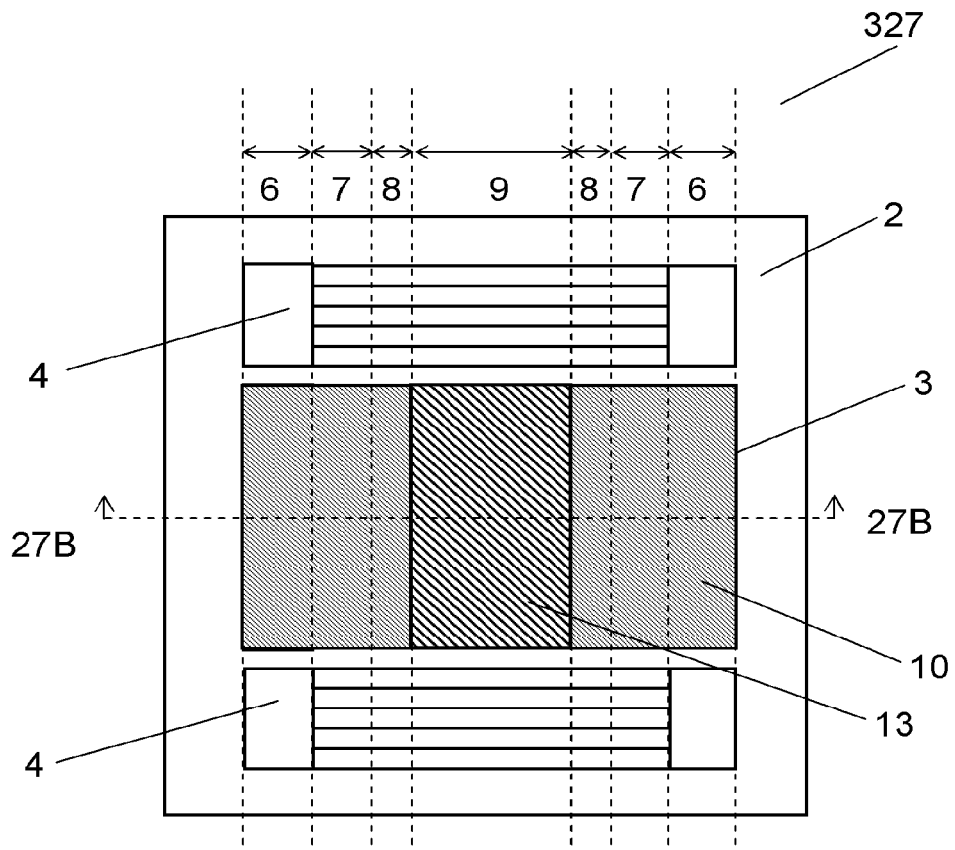
FIG. 27A is a top schematic view of an elastic wave element in accordance with a seventh exemplary embodiment of the present invention.
Figure 27B:
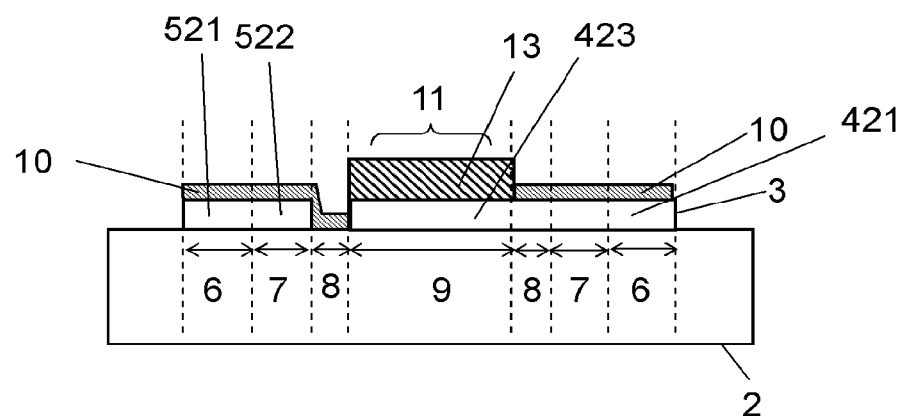
FIG. 27B is a sectional schematic view taken on line 27B-27B of FIG. 27A.

FIG. 27A is a top schematic view of elastic wave element 327 in accordance with a seventh exemplary embodiment of the present invention. FIG. 27B is a sectional schematic view taken on line 27B-27B (in an extending direction of electrode fingers) of FIG. 27A. In this exemplary embodiment, configurations of piezoelectric substrate 2, IDT electrode 3, and reflector electrode 4 are the same as those in FIG. 1D. Intermediate region 8 includes first dielectric film 10, and alternately disposed region 9 includes third dielectric film 13 in which acoustic velocity of a propagating transverse wave is higher than acoustic velocity of a transverse wave propagating in first dielectric film 10.

When first dielectric film 10 is made of, for example, tantalum oxide, third dielectric film 13 is made of silicon oxide ($SiO_2$), silicon nitride ($Si_3N_4$), aluminum nitride (AlN), aluminum oxide ($Al_2O_3$), diamond (C), silicon (Si), or the like. Third dielectric film 13 only needs to be an insulating medium in which the acoustic velocity of the transverse wave propagating in third dielectric film 13 is higher than the acoustic velocity of the transverse wave propagating in first dielectric film 10.

With the above-mentioned configuration, in elastic wave element 327, a difference between acoustic velocity of a main elastic wave in intermediate region 8 and acoustic velocity of a main elastic wave in alternately disposed region 9 can be reduced. That is to say, the acoustic velocity of the main elastic wave in intermediate region 8 can be made to be lower than the acoustic velocity of the main elastic wave in alternately disposed region 9. Therefore, leakage of the main elastic wave in alternately disposed region 9 into intermediate region 8 can be suppressed. As a result, the characteristic loss of wave element 327 can be reduced.

Furthermore, when third dielectric film 13 formed in alternately disposed region 9 is made of silicon oxide ($SiO_2$), since a temperature coefficient of frequency of silicon oxide ($SiO_2$) is opposite to that of piezoelectric substrate 2, frequency temperature characteristics of elastic wave element 327 is improved in addition to the above-mentioned effect.

Furthermore, a boundary between first dielectric film 10 and third dielectric film 13 may be in alternately disposed region 9 of IDT electrode 3. With such a configuration, since the boundary between first dielectric film 10 and third dielectric film 13 may not be positioned at the tip ends of first electrode fingers 423 and second electrode fingers 523, characteristics variation due to manufacturing variation of elastic wave element 327 can be suppressed. Furthermore, in elastic wave element 327, the main elastic wave of alternately disposed region 9 is further concentrated into center portion 11 of alternately disposed region 9, so that it is possible to further suppress leakage thereof into intermediate region 8. As a result, characteristic loss of elastic wave element 327 can be reduced.

Furthermore, the boundary between first dielectric film 10 and third dielectric film 13 may be in intermediate region 8 of IDT electrode 3. Also in this case, since the boundary between first dielectric film 10 and third dielectric film 13 may not be positioned at the tip ends of first electrode fingers 423 and second electrode fingers 523, characteristics variation due to manufacturing variation of elastic wave element 327 can be suppressed. Furthermore, since there is no boundary between first dielectric film 10 and third dielectric film 13 in alternately disposed region 9 of IDT electrode 3, deterioration of characteristics of elastic wave element 327 can be suppressed.

Figure 28A:
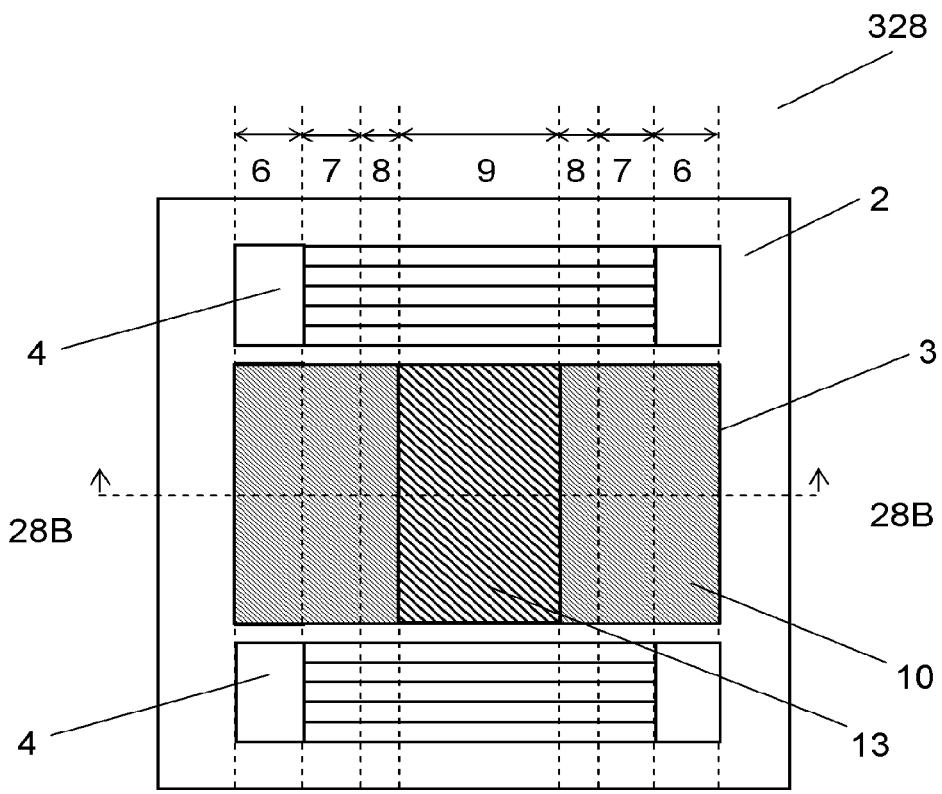
FIG. 28A is a top schematic view of another elastic wave element in accordance with the seventh exemplary embodiment of the present invention.
Figure 28B:
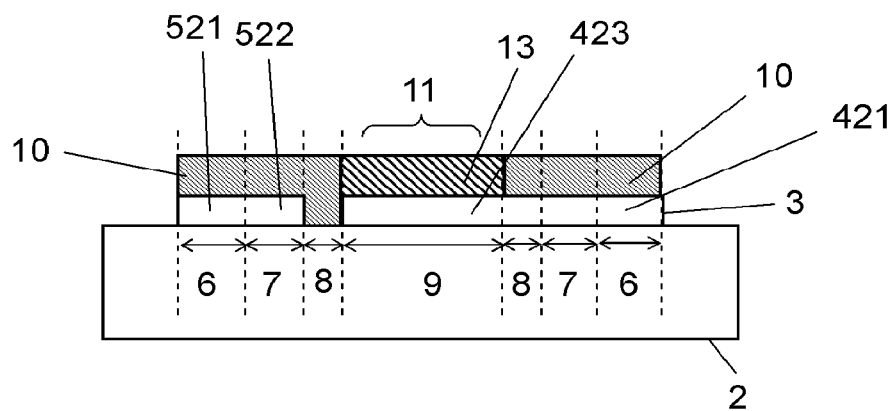
FIG. 28B is a sectional schematic view taken on line 28B-28B of FIG. 28A.

FIGS. 27A and 27B show a configuration when the thickness of first dielectric film 10 is smaller than that of IDT electrode 3. On the other hand, FIGS. 28A and 28B show elastic wave element 328 when the thickness of first dielectric film 10 is larger than that of IDT electrode 3. Also in this case, it is possible to suppress leakage of the main elastic wave of alternately disposed region 9 into intermediate region 8.

Eighth Exemplary Embodiment

Figure 29A:
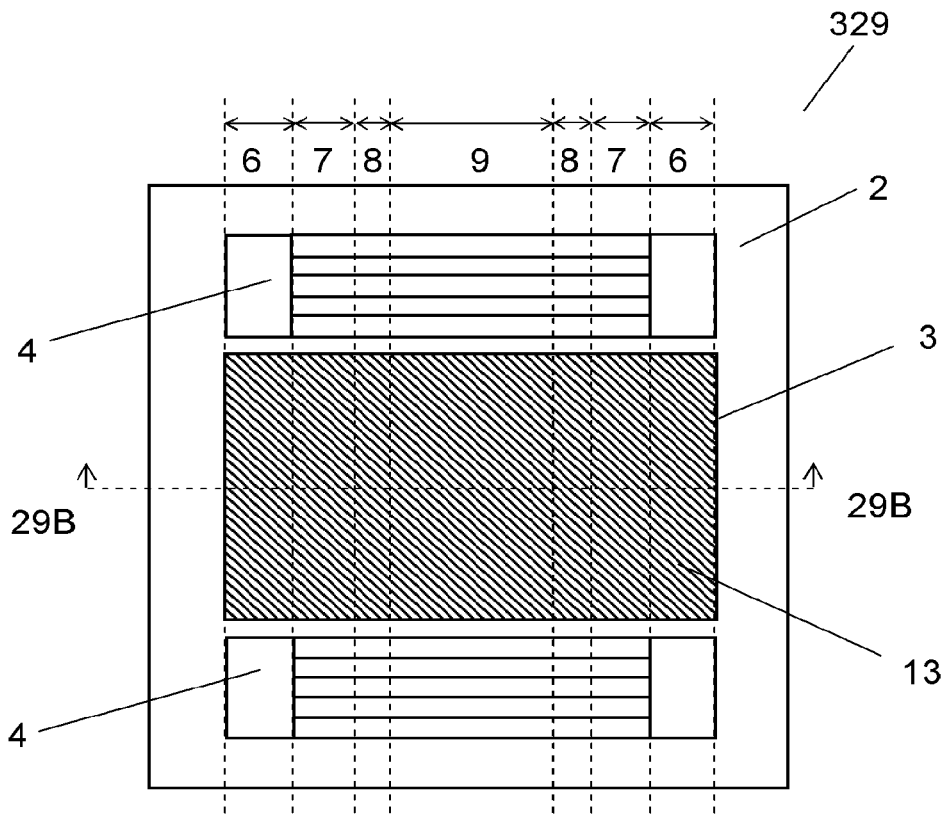
FIG. 29A is a top schematic view of an elastic wave element in accordance with an eighth exemplary embodiment of the present invention.
Figure 29B:
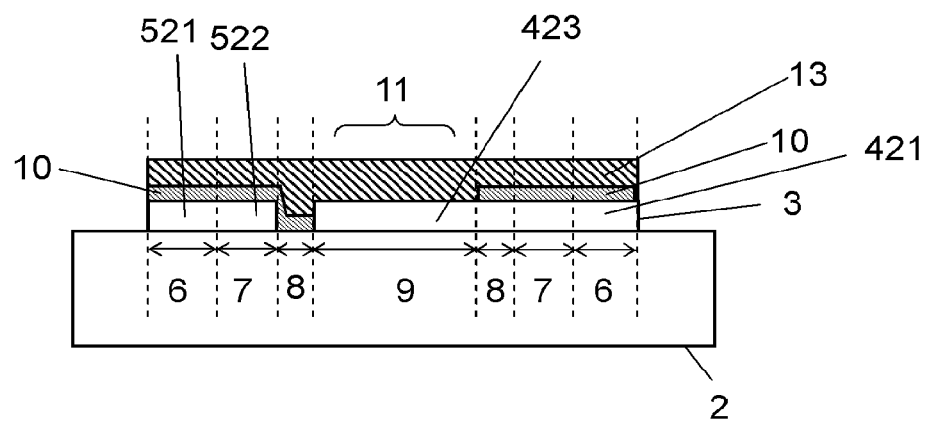
FIG. 29B is a sectional schematic view taken on line 29B-29B of FIG. 29A.

FIG. 29A is a top schematic view of elastic wave element 329 in accordance with an eighth exemplary embodiment of the present invention. FIG. 29B is a sectional schematic view taken on line 29B-29B (in an extending direction of electrode fingers) of FIG. 29A. In this exemplary embodiment, configurations of piezoelectric substrate 2, IDT electrode 3, and reflector electrode 4 are the same as those in FIG. 1D. In intermediate region 8, first dielectric film 10 is formed, in which acoustic velocity of a propagating transverse wave is lower than that in the main elastic wave of alternately disposed region 9. Furthermore, on first dielectric film 10 and in alternately disposed region 9, third dielectric film 13 is formed, in which acoustic velocity of a propagating transverse wave is higher than acoustic velocity of a transverse wave propagating in first dielectric film 10. By protecting first dielectric film 10 with third dielectric film 13, a change overtime of the frequency characteristics of elastic wave element 329 is suppressed, thus improving a passivation effect.

With the above-mentioned configuration, in elastic wave element 329, a difference between the acoustic velocity of the main elastic wave in intermediate region 8 and the acoustic velocity of the main elastic wave in alternately disposed region 9 can be reduced. That is to say, the acoustic velocity of the main elastic wave in intermediate region 8 can be lower than the acoustic velocity of the main elastic wave in alternately disposed region 9. Therefore, leakage of the main elastic wave of alternately disposed region 9 into intermediate region 8 can be suppressed. As a result, the characteristic loss of elastic wave element 329 can be further reduced.

Furthermore, first dielectric film 10 may be formed in a part of alternately disposed region 9. That is to say, a boundary between first dielectric film 10 and third dielectric film 13 may be in alternately disposed region 9. With such a configuration, the boundary between first dielectric film 10 and third dielectric film 13 may not be positioned at the tip ends of first electrode fingers 423 and second electrode fingers 523. Consequently, characteristics variation due to manufacturing variation of elastic wave element 329 can be suppressed. Furthermore, in elastic wave element 329, the main elastic wave of alternately disposed region 9 is further concentrated in center portion 11 of alternately disposed region 9, leakage of intermediate region 8 can be further suppressed. As a result, characteristic loss of elastic wave element 329 can be reduced. Furthermore, first dielectric film 10 may not be formed in a part of intermediate region 8. That is to say, a boundary between first dielectric film 10 and third dielectric film 13 may be in intermediate region 8. Also with such a configuration, the boundary between first dielectric film 10 and third dielectric film 13 may not be positioned at the tip ends of first electrode fingers 423 and second electrode fingers 523. Consequently, characteristics variation due to manufacturing variation of elastic wave element 329 can be suppressed. Furthermore, since there is no boundary between first dielectric film 10 and third dielectric film 13 in alternately disposed region 9, deterioration of characteristics of elastic wave element 329 can be suppressed.

Figure 30A:
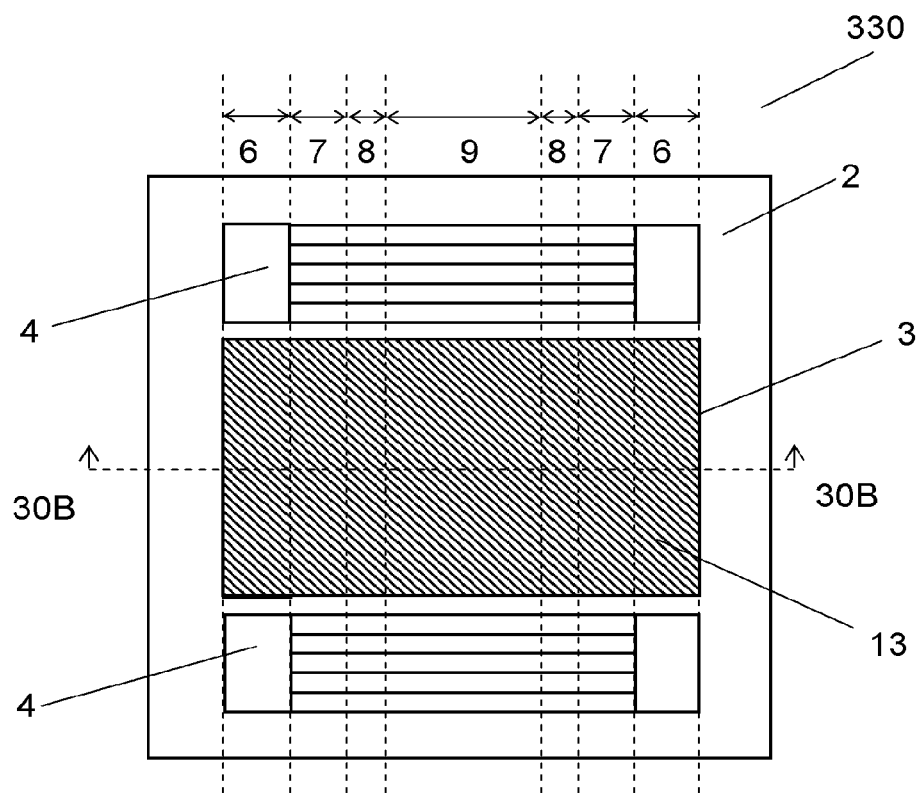
FIG. 30A is a top schematic view of another elastic wave element in accordance with the eighth exemplary embodiment of the present invention.
Figure 30B:
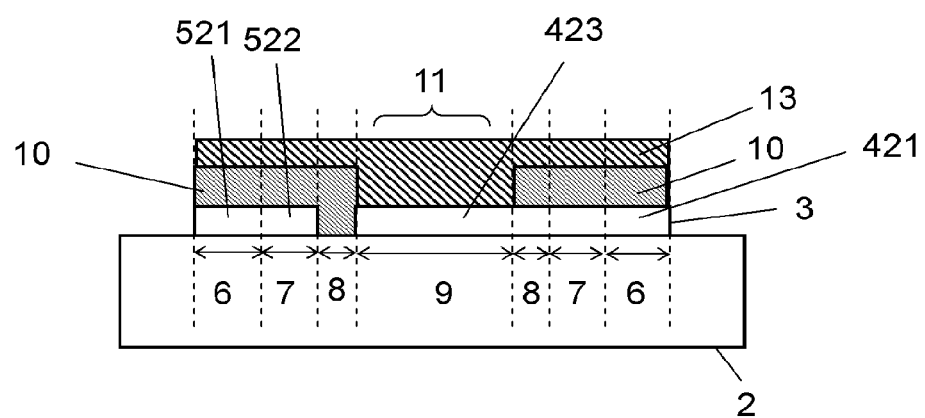
FIG. 30B is a sectional schematic view taken on line 30B-30B of FIG. 30A.

FIGS. 29A and 29B show a configuration when the thickness of first dielectric film 10 is smaller than that of IDT electrode 3. On the other hand, FIGS. 30A and 30B show elastic wave element 330 when the thickness of first dielectric film 10 is larger than that of IDT electrode 3. Also in this case, the above-mentioned effect can be obtained.

Ninth Exemplary Embodiment

Figure 31A:
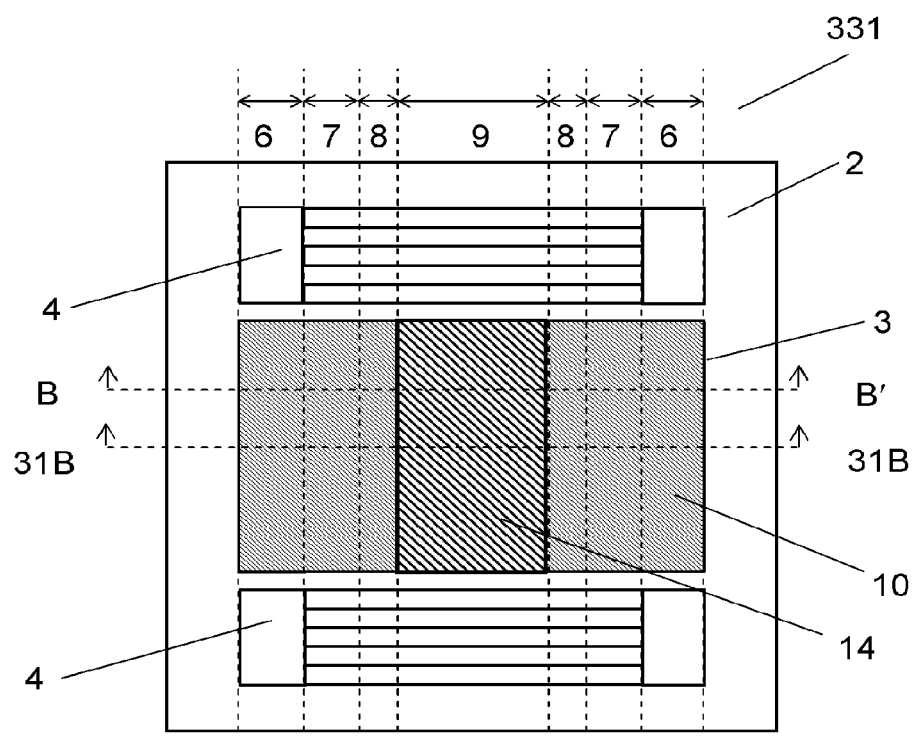
FIG. 31A is a top schematic view of an elastic wave element in accordance with a ninth exemplary embodiment of the present invention.
Figure 31B:
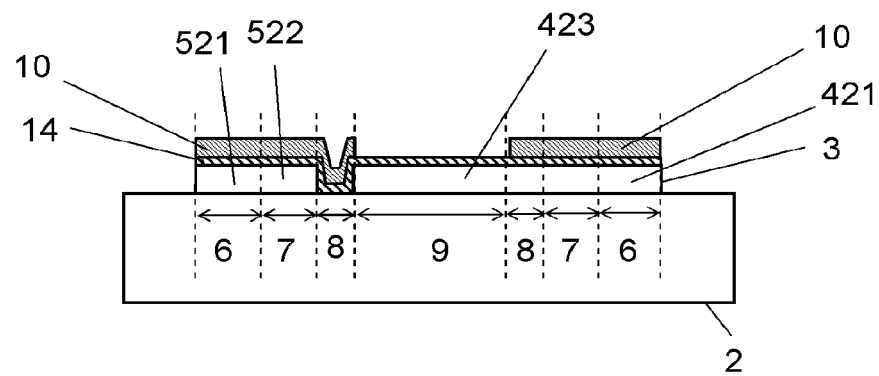
FIG. 31B is a sectional schematic view taken on line 31B-31B of FIG. 31A.
Figure 31C:
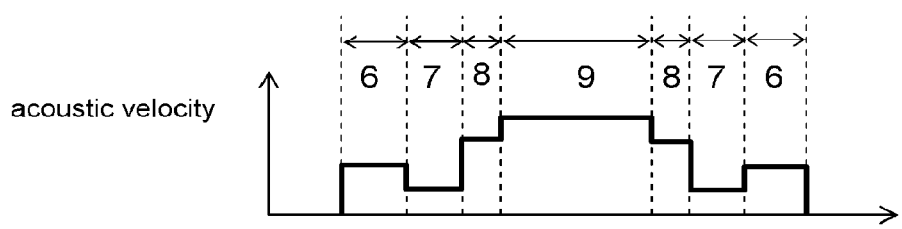
FIG. 31C is a graph showing acoustic velocity of a main elastic wave of FIG. 31B.

FIG. 31A is a top schematic view of elastic wave element 331 in accordance with a ninth exemplary embodiment of the present invention. FIG. 31B is a sectional schematic view taken on line 31B-31B (in an extending direction of electrode fingers) of FIG. 31A. FIG. 31C is a graph showing a velocity of a main elastic wave in FIG. 31B. In this exemplary embodiment, configurations of piezoelectric substrate 2, IDT electrode 3, and, reflector electrode 4 are the same as those in FIG. 1D.

The ninth exemplary embodiment is different from first exemplary embodiment in that fourth dielectric film 14 is formed between first dielectric film 10 and IDT electrode 3. Fourth dielectric film 14 is used for preventing oxidization, corrosion, disconnection, or the like, of electrode, and includes material such as MN, $Al_2O_3$, $SiO_2$, SiN, and SiON. By protecting the IDT electrode by fourth dielectric film 14, deterioration of characteristics of elastic wave element 331 in a formation process of first dielectric film 10 is suppressed, and a passivation effect can be enhanced. Note here that fourth dielectric film 14 may not be formed in alternately disposed region 9.

Also in the above-mentioned configuration, a difference between acoustic velocity of a main elastic wave in intermediate region 8 and acoustic velocity of a main elastic wave in alternately disposed region 9 can be reduced. That is to say, the acoustic velocity of the main elastic wave in intermediate region 8 can be made to be lower than the acoustic velocity of the main elastic wave in alternately disposed region 9. Therefore, it is possible to further suppress leakage of the main elastic wave of alternately disposed region 9 into intermediate region 8. As a result, characteristic loss of elastic wave element 331 can be further reduced.

Figure 32A:
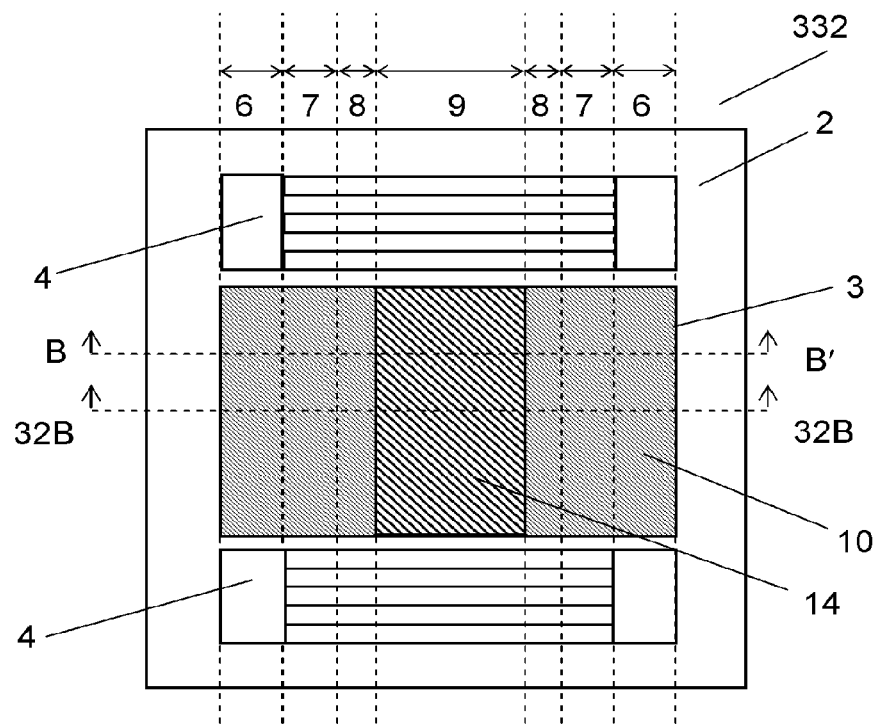
FIG. 32A is a top schematic view of another elastic wave element in accordance with the ninth exemplary embodiment of the present invention.
Figure 32B:
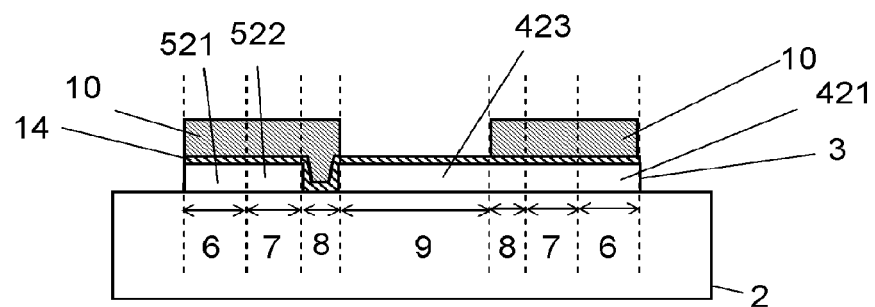
FIG. 32B is a sectional schematic view taken on line 32B-32B of FIG. 32A.
Figure 32C:
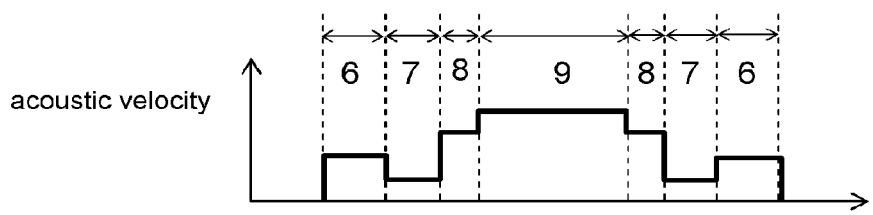
FIG. 32C is a graph showing acoustic velocity of a main elastic wave of FIG. 32B.

Note here that FIGS. 31A to 31C show structures and characteristics when a thickness of first dielectric film 10 is smaller than that of IDT electrode 3. FIGS. 32A and 32B show a structure of elastic wave element 332 when the thickness of first dielectric film 10 is larger than that of IDT electrode 3, and FIG. 32C shows characteristics thereof. Also in this case, the above-mentioned effect can be obtained.

Tenth Exemplary Embodiment

Figure 33A:
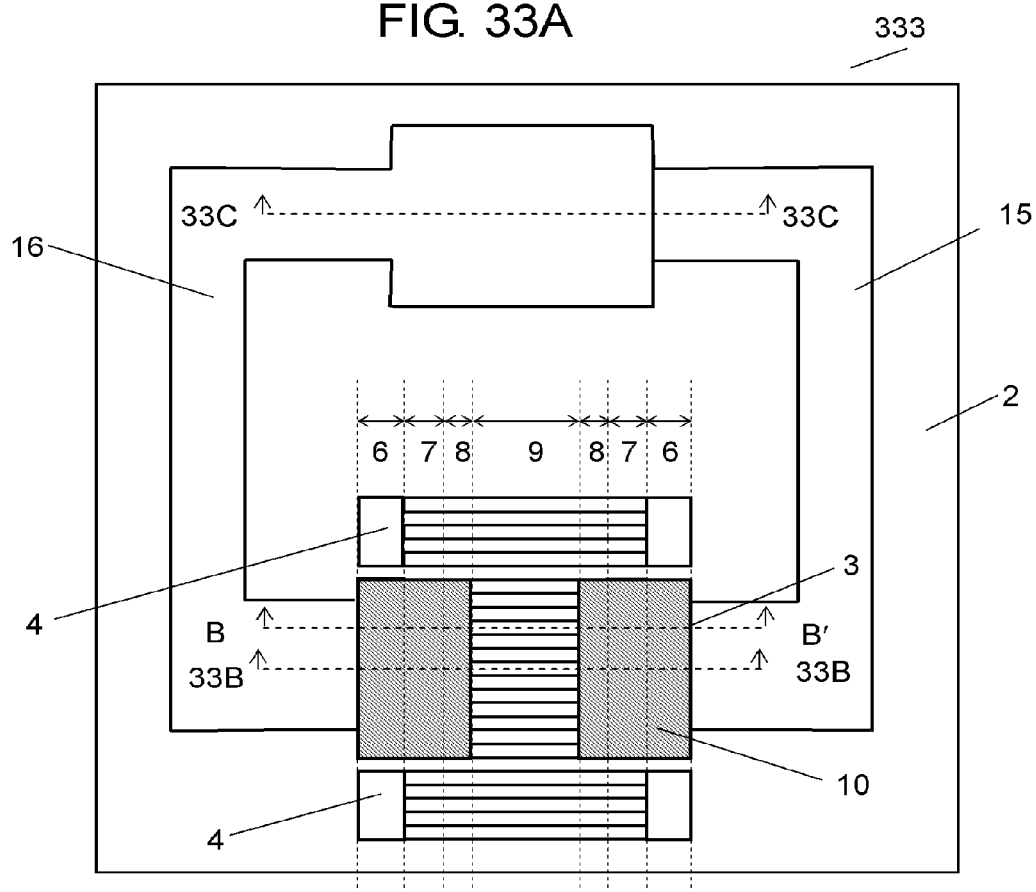
FIG. 33A is a top schematic view of an elastic wave element in accordance with a tenth exemplary embodiment of the present invention.
Figure 33B:
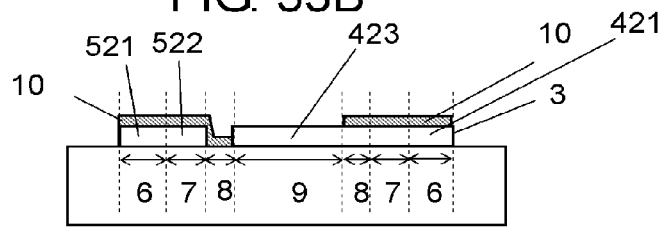
FIG. 33B is a sectional schematic view taken on line 33B-33B of FIG. 33A.
Figure 33C:
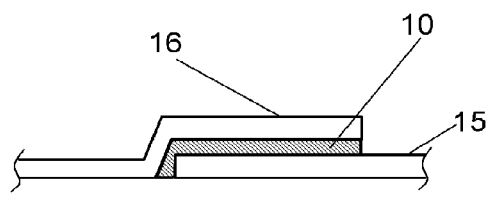
FIG. 33C is a sectional schematic view taken on line 33C-33C of FIG. 33A.

FIG. 33A is a top schematic view of elastic wave element 333 in accordance with a tenth exemplary embodiment of the present invention. FIG. 33B is a sectional schematic view taken on line 33B-33B (in an extending direction of electrode fingers) of FIG. 33A. FIG. 33C is a sectional schematic view of a wiring electrode taken on line 33C-33C of FIG. 33A. In this exemplary embodiment, configurations of piezoelectric substrate 2, IDT electrode 3, and reflector electrode 4 are the same as those in FIG. 1D.

In this exemplary embodiment, as shown in FIGS. 33A to 33C, first dielectric film 10 is formed in intermediate region 8 and on first wiring electrode 15 of elastic wave element 333. Second wiring electrode 16 is formed in the upper side of first dielectric film 10. First wiring electrode 15 and second wiring electrode 16 are disposed on piezoelectric substrate 2 and electrically connect IDT electrode 3 to other circuit, electrode, terminals and the like.

With the above-mentioned configuration, a difference between acoustic velocity of a main elastic wave in intermediate region 8 and acoustic velocity of a main elastic wave in alternately disposed region 9 can be reduced. That is to say, the acoustic velocity of the main elastic wave in intermediate region 8 can be made to be lower than the acoustic velocity of the main elastic wave in alternately disposed region 9. Therefore, leakage of the main elastic wave of alternately disposed region 9 into intermediate region 8 can be suppressed. Furthermore, capacitance generated when first dielectric film 10 is formed in a region in which first wiring electrode 15 and second wiring electrode 16 three-dimensionally intersect with each other, antiresonant frequency of elastic wave element 333 can be controlled.

Figure 34A:
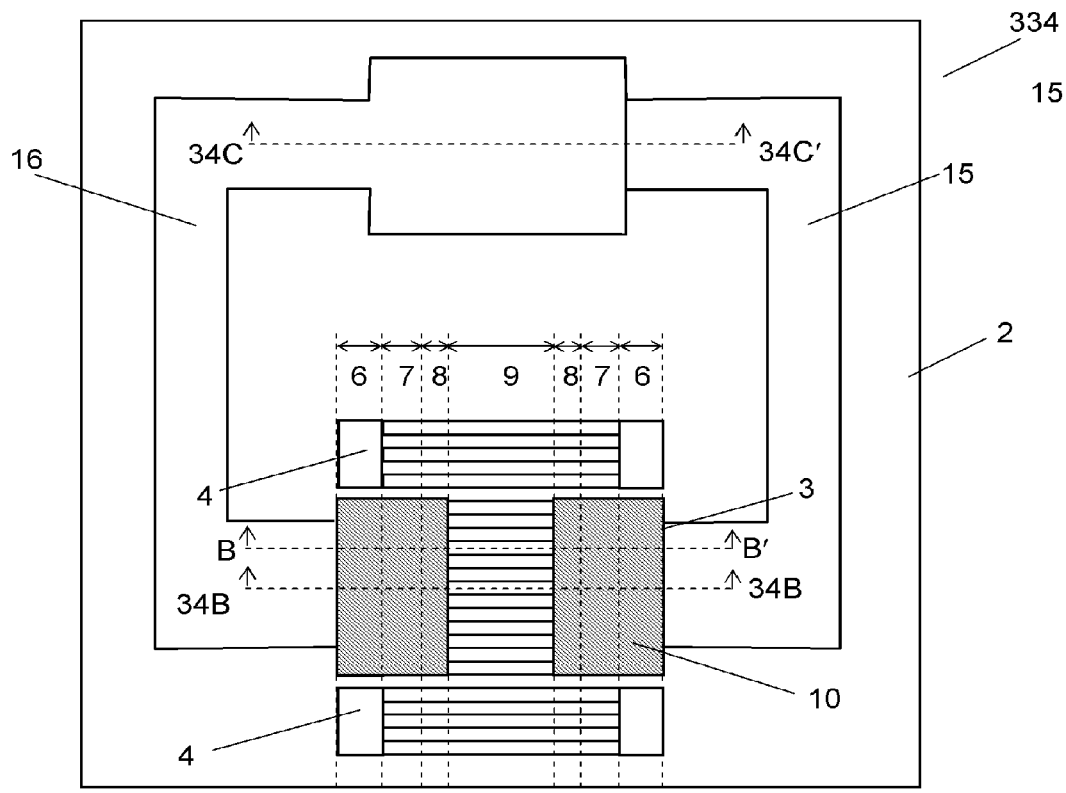
FIG. 34A is a top schematic view of another elastic wave element in accordance with the tenth exemplary embodiment of the present invention.
Figure 34B:
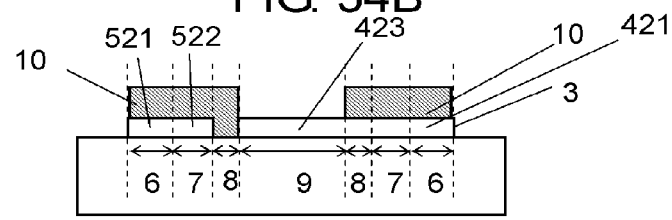
FIG. 34B is a sectional schematic view taken on line 34B-34B of FIG. 34A.
Figure 34C:
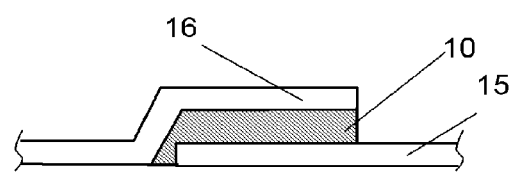
FIG. 34C is a sectional schematic view taken on line 34C-34C of FIG. 34A.
Figure 35A:
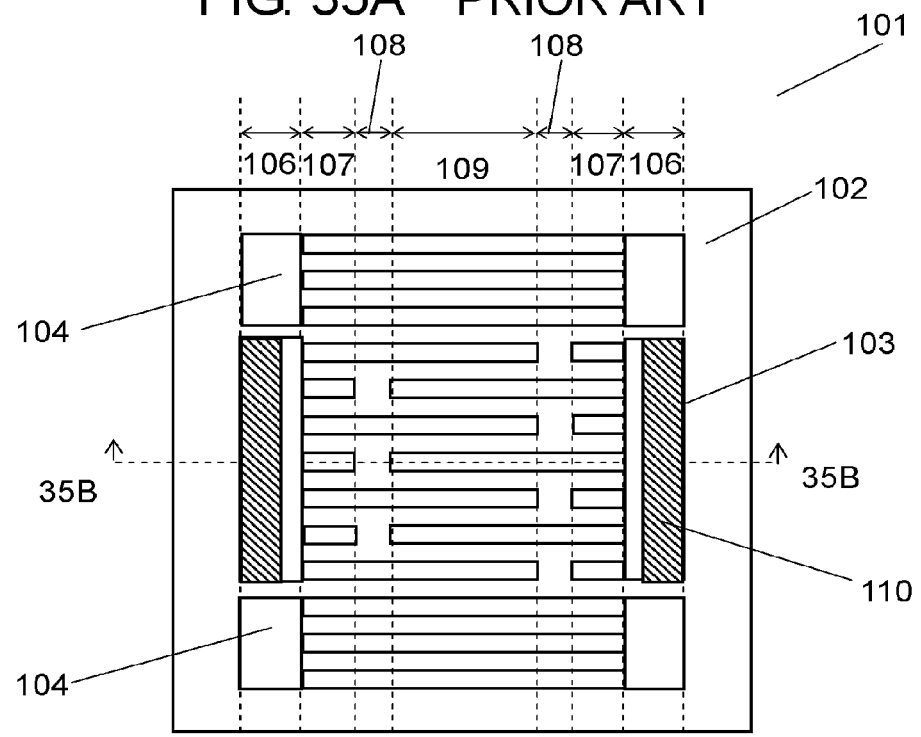
FIG. 35A is a top schematic view of a conventional elastic wave element.
Figure 35B:
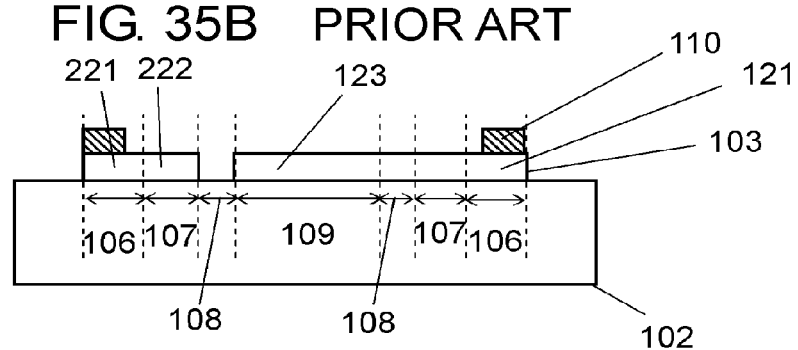
FIG. 35B is a sectional schematic view taken on line 35B-35B of FIG. 35A.
Figure 35C:
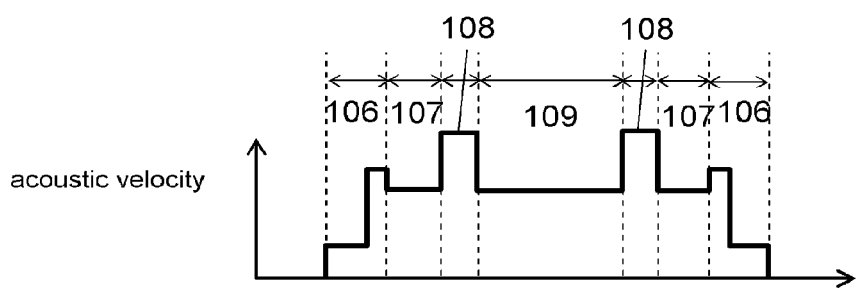
FIG. 35C is a graph showing acoustic velocity of a main elastic wave of FIG. 35B.
Figure 35D:
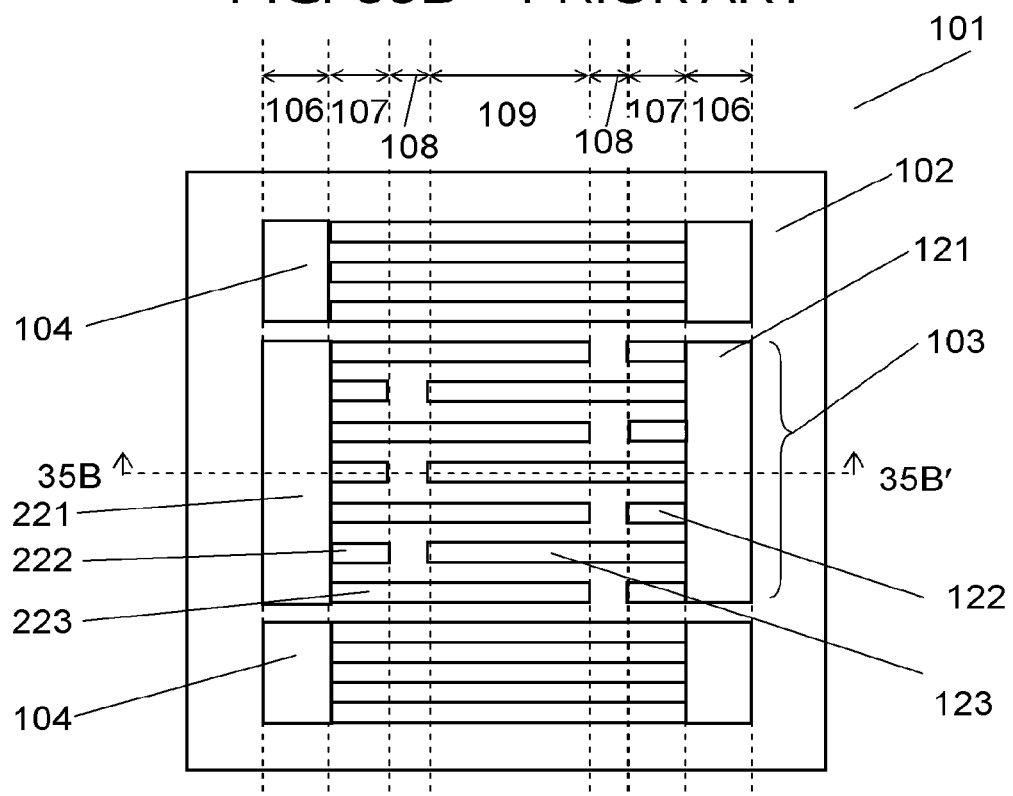
FIG. 35D is a top schematic view showing configurations of conventional piezoelectric substrate, IDT electrode, and reflector electrode.

Note here that FIGS. 33A to 33C show a structure and characteristics of elastic wave element 333 when the film thickness of first dielectric film 10 is smaller than the film thickness of IDT electrode 3. On the other hand, FIGS. 34A to 34C show elastic wave element 334 when the film thickness of first dielectric film 10 is larger than the film thickness of IDT electrode 3. Also in this case, the same effect as mentioned above can be obtained.

INDUSTRIAL APPLICABILITY

An elastic wave element in accordance with the present invention has an effect that leakage of a main elastic wave from an alternately disposed region to an intermediate region can be suppressed, and is applied to electronic apparatuses such as a portable telephone.

REFERENCE MARKS IN THE DRAWINGS 1, 101, 302, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334 elastic wave element
2 piezoelectric substrate
3 IDT electrode
4 reflector electrode
6 bus bar electrode region
7 dummy electrode region
8 intermediate region
9 alternately disposed region
10 first dielectric film
11 center portion
12 second dielectric film
13 third dielectric film
14 fourth dielectric film
15 first wiring electrode
16 second wiring electrode
60 electrode pitch
61 width of alternately disposed region (intersection width of electrode finger)
62 width of dummy electrode region (length of dummy electrodes)
421 first bus bar electrode
521 second bus bar electrode
422 first dummy electrode
522 second dummy electrode
423 first electrode finger
523 second electrode finger
600, 610 arrow
700 laminated body

What is claimed is:

1. An elastic wave device comprising:
an interdigital transducer (IDT) electrode in contact with a piezoelectric substrate, the IDT electrode including a first bus bar electrode, a second bus bar electrode facing the first bus bar electrode, first electrode fingers extending from the first bus bar electrode toward the second bus bar electrode, and second electrode fingers extending from the second bus bar electrode toward the first bus bar electrode, the first electrode fingers alternately disposed with the second electrode fingers, the piezoelectric substrate including a bus bar electrode region including one of the first bus bar electrode and the second bus bar electrode, an alternately disposed region where the first electrode fingers are alternately disposed with the second electrode fingers, and an intermediate region including one of the first electrode fingers and the second electrode fingers; and
a first dielectric film formed in at least part of the intermediate region and in contact with an upper surface of the IDT electrode, the first dielectric film including a medium in which an acoustic velocity of a transverse wave propagating in the first dielectric film is lower than an acoustic velocity of a main elastic wave of the alternately disposed region, the first dielectric film not being formed in the alternately disposed region, an end portion of the first dielectric film in an extending direction of the first electrode fingers and the second electrode fingers having a tapered shape in which a film thickness of the first dielectric film is gradually reduced in a direction from the bus bar electrode region toward the alternately disposed region.

2. The elastic wave device of claim 1 wherein the first dielectric film is not formed in a part of the intermediate region.

3. The elastic wave device of claim 1 wherein the first dielectric film is further formed in the bus bar electrode region.

4. The elastic wave device of claim 1 wherein the IDT electrode further includes first dummy electrodes extending from the first bus bar electrode toward the second bus bar electrode and second dummy electrodes extending from the second bus bar electrode toward the first bus bar electrode, the piezoelectric substrate including a dummy electrode region including one of the first dummy electrodes and the second dummy electrodes.

5. The elastic wave device of claim 4 wherein the first dielectric film is further formed in the dummy electrode region.

6. The elastic wave device of claim 1 wherein the first dielectric film is thinner than the IDT electrode.

7. The elastic wave device of claim 1 wherein the first dielectric film is thicker than the IDT electrode.

8. The elastic wave device of claim 1 further comprising a second dielectric film distinct from the first dielectric film formed in at least part of the alternately disposed region and in contact with an upper surface of the IDT electrode, the second dielectric film including a medium in which an acoustic velocity of a transverse wave propagating in the second dielectric film is higher than the acoustic velocity of the main elastic wave in the intermediate region.

9. The elastic wave device of claim 8 wherein the second dielectric film extends into a part of the intermediate region.

10. The elastic wave device of claim 9 wherein a boundary between the first dielectric film and the second dielectric film exists in the intermediate region.

11. The elastic wave device of claim 8 wherein the second dielectric film is thicker than the first dielectric film.

12. The elastic wave device of claim 8 wherein the second dielectric film and the first dielectric film have substantially similar thicknesses.

13. The elastic wave device of claim 8 wherein the second dielectric film is formed on an upper surface of the first dielectric film.

14. An elastic wave device comprising:
an interdigital transducer (IDT) electrode in contact with a piezoelectric substrate, the IDT electrode including a first bus bar electrode, a second bus bar electrode facing the first bus bar electrode, first electrode fingers extending from the first bus bar electrode toward the second bus bar electrode, and second electrode fingers extending from the second bus bar electrode toward the first bus bar electrode, the first electrode fingers alternately disposed with the second electrode fingers, the piezoelectric substrate including a bus bar electrode region including one of the first bus bar electrode and the second bus bar electrode, an alternately disposed region where the first electrode fingers are alternately disposed with the second electrode fingers, and an intermediate region including one of the first electrode fingers and the second electrode fingers; and a first dielectric film formed in the alternately disposed region and in contact with an upper surface of the IDT electrode, the first dielectric film extending across an entirety of the alternately disposed region in an extending direction of the first electrode fingers and the second electrode fingers and extending continuously into the intermediate region and the bus bar region, the first dielectric film being thicker in the alternately disposed region than in the intermediate region and in the bus bar region, the first dielectric film including a medium in which an acoustic velocity of a transverse wave propagating in the first dielectric film is higher than an acoustic velocity of a main elastic wave in the intermediate region.

15. The elastic wave device of claim 14 wherein the first dielectric film is formed on an upper surface of a second dielectric film disposed in the intermediate region and in the bus bar region, the second dielectric film including a medium in which an acoustic velocity of a transverse wave propagating in the second dielectric film is lower than the acoustic velocity of the main elastic wave of the alternately disposed region.

16. The elastic wave device of claim 14 wherein a second dielectric film is formed on an upper surface of the first dielectric film disposed in the intermediate region and in the bus bar region, the second dielectric film including a medium in which an acoustic velocity of a transverse wave propagating in the second dielectric film is lower than the acoustic velocity of the main elastic wave of the alternately disposed region.

17. An elastic wave device comprising:
an interdigital transducer (IDT) electrode in contact with a piezoelectric substrate, the IDT electrode including a first bus bar electrode, a second bus bar electrode facing the first bus bar electrode, first electrode fingers extending from the first bus bar electrode toward the second bus bar electrode, and second electrode fingers extending from the second bus bar electrode toward the first bus bar electrode, the first electrode fingers alternately disposed with the second electrode fingers, the piezoelectric substrate including a bus bar electrode region including one of the first bus bar electrode and the second bus bar electrode, an alternately disposed region where the first electrode fingers are alternately disposed with the second electrode fingers, and an intermediate region including one of the first electrode fingers and the second electrode fingers; and a dielectric film formed in the alternately disposed region and in contact with an upper surface of the IDT electrode in the alternately disposed region only, the dielectric film including a medium in which an acoustic velocity of a transverse wave propagating in the dielectric film is higher than an acoustic velocity of a main elastic wave in the intermediate region, side portions of the dielectric film having a tapered shape in an extending direction of the first electrode fingers and the second electrode fingers in which a film thickness of the dielectric film is gradually reduced from a greatest thickness in a central portion of the alternately disposed region to zero on the first electrode fingers and the second electrode fingers in the alternately disposed region.

18. The elastic wave device of claim 17 wherein the dielectric film is made of one of silicon nitride, aluminum nitride, aluminum oxide, diamond, and silicon.

19. An elastic wave device comprising:
an interdigital transducer (IDT) electrode in contact with a piezoelectric substrate, the IDT electrode including a first bus bar electrode, a second bus bar electrode facing the first bus bar electrode, first electrode fingers extending from the first bus bar electrode toward the second bus bar electrode, and second electrode fingers extending from the second bus bar electrode toward the first bus bar electrode, the first electrode fingers alternately disposed with the second electrode fingers, the piezoelectric substrate including a bus bar electrode region including one of the first bus bar electrode and the second bus bar electrode, an alternately disposed region where the first electrode fingers are alternately disposed with the second electrode fingers, and an intermediate region including one of the first electrode fingers and the second electrode fingers;
a first dielectric film formed in at least part of the intermediate region and in contact with an upper surface of the IDT electrode, the first dielectric film including a medium in which an acoustic velocity of a transverse wave propagating in the first dielectric film is lower than an acoustic velocity of a main elastic wave of the alternately disposed region, the first dielectric film not being formed in the alternately disposed region; and
a second dielectric film distinct from the first dielectric film formed in at least part of the alternately disposed region and in contact with an upper surface of the IDT electrode, the second dielectric film including a medium in which an acoustic velocity of a transverse wave propagating in the second dielectric film is higher than the acoustic velocity of the main elastic wave in the intermediate region, the second dielectric film extending into a part of the intermediate region.

20. An elastic wave device comprising:
an interdigital transducer (IDT) electrode in contact with a piezoelectric substrate, the IDT electrode including a first bus bar electrode, a second bus bar electrode facing the first bus bar electrode, first electrode fingers extending from the first bus bar electrode toward the second bus bar electrode, and second electrode fingers extending from the second bus bar electrode toward the first bus bar electrode, the first electrode fingers alternately disposed with the second electrode fingers, the piezoelectric substrate including a bus bar electrode region including one of the first bus bar electrode and the second bus bar electrode, an alternately disposed region where the first electrode fingers are alternately disposed with the second electrode fingers, and an intermediate region including one of the first electrode fingers and the second electrode fingers;
a first dielectric film formed in at least part of the intermediate region and in contact with an upper surface of the IDT electrode, the first dielectric film including a medium in which an acoustic velocity of a transverse wave propagating in the first dielectric film is lower than an acoustic velocity of a main elastic wave of the alternately disposed region, the first dielectric film not being formed in the alternately disposed region; and
a second dielectric film distinct from the first dielectric film formed in at least part of the alternately disposed region and in contact with an upper surface of the IDT electrode, the second dielectric film including a medium in which an acoustic velocity of a transverse wave propagating in the second dielectric film is higher than the acoustic velocity of the main elastic wave in the intermediate region, the second dielectric film being thicker than the first dielectric film.

21. An elastic wave device comprising:
an interdigital transducer (IDT) electrode in contact with a piezoelectric substrate, the IDT electrode including a first bus bar electrode, a second bus bar electrode facing the first bus bar electrode, first electrode fingers extending from the first bus bar electrode toward the second bus bar electrode, and second electrode fingers extending from the second bus bar electrode toward the first bus bar electrode, the first electrode fingers alternately disposed with the second electrode fingers, the piezoelectric substrate including a bus bar electrode region including one of the first bus bar electrode and the second bus bar electrode, an alternately disposed region where the first electrode fingers are alternately disposed with the second electrode fingers, and an intermediate region including one of the first electrode fingers and the second electrode fingers; and
a dielectric film formed in at least part of the intermediate region and in contact with an upper surface of the IDT electrode, the dielectric film including a medium in which an acoustic velocity of a transverse wave propagating in the dielectric film is lower than an acoustic velocity of a main elastic wave of the alternately disposed region, the dielectric film extending only partially into the alternately disposed region.

* * * * *

UNITED STATES PATENT AND TRADEMARK OFFICE
CERTIFICATE OF CORRECTION

| | |
|---|---|
| PATENT NO. | : 9,748,924 B2 |
| APPLICATION NO. | : 14/809994 |
| DATED | : August 29, 2017 |
| INVENTOR(S) | : Tomoya Komatsu et al. |

It is certified that error appears in the above-identified patent and that said Letters Patent is hereby corrected as shown below:

In the Specification

Column 13, Line 7, insert -- is -- between "10" and "larger".

Signed and Sealed this
Tenth Day of October, 2017

Joseph Matal
*Performing the Functions and Duties of the*
*Under Secretary of Commerce for Intellectual Property and*
*Director of the United States Patent and Trademark Office*